(12) United States Patent
Shiraishi et al.

(10) Patent No.: US 7,981,747 B2
(45) Date of Patent: Jul. 19, 2011

(54) SEMICONDUCTOR DEVICE AND A METHOD OF MANUFACTURING THE SAME

(75) Inventors: Masaki Shiraishi, Hitachi (JP); Yoshito Nakazawa, Isesaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/385,979

(22) Filed: Apr. 27, 2009

(65) Prior Publication Data

US 2009/0212358 A1    Aug. 27, 2009

Related U.S. Application Data

(63) Continuation of application No. 11/657,592, filed on Jan. 25, 2007, now abandoned, which is a continuation of application No. 10/886,041, filed on Jul. 8, 2004, now abandoned.

(30) Foreign Application Priority Data

Aug. 4, 2003   (JP) ................................. 2003-286142

(51) Int. Cl.
*H01L 29/72*   (2006.01)
(52) U.S. Cl. ........ 438/270; 438/197; 438/289; 438/306; 438/524; 438/529; 438/530
(58) Field of Classification Search ................ 438/197, 438/270, 289, 306, 524, 529, 530
See application file for complete search history.

(56) References Cited

U.S. PATENT DOCUMENTS

| | | | |
|---|---|---|---|
| 5,282,018 A * | 1/1994 | Hiraki et al. ................. 257/296 |
| 5,321,289 A | 6/1994 | Baba et al. |
| 6,084,264 A * | 7/2000 | Darwish ..................... 257/329 |
| 6,150,693 A | 11/2000 | Wollesen |
| 6,348,712 B1 | 2/2002 | Korec et al. |
| 6,541,818 B2 | 4/2003 | Pfirsch et al. |
| 2001/0001494 A1 | 5/2001 | Kocon |
| 2002/0125510 A1* | 9/2002 | Ohyanagi et al. ............ 257/288 |

FOREIGN PATENT DOCUMENTS

| | | |
|---|---|---|
| JP | 60-186068 | 9/1985 |
| JP | 06-053514 | 2/1994 |
| JP | 06-132539 | 5/1994 |
| JP | 2000-164869 | 3/1999 |
| JP | 2000-299464 | 3/2000 |
| JP | 2000-269487 | 9/2000 |
| JP | 2000-269518 | 9/2000 |

(Continued)

*Primary Examiner* — Edward Wojciechowicz
(74) *Attorney, Agent, or Firm* — Stites & Harbison, PLLC; Juan Carlos A. Marquez, Esq

(57) ABSTRACT

A technology is provided to reduce ON-resistance, and the prevention of punch through is achieved with respect to a trench gate type power MISFET. Input capacitance and a feedback capacitance are reduced by forming a groove in which a gate electrode is formed so as to have a depth as shallow as about 1 μm or less, a p⁻type semiconductor region is formed to a depth so as not to cover the bottom of the groove, and a p-type semiconductor region higher in impurity concentration than the p⁻type semiconductor region is formed under a n⁺type semiconductor region serving as a source region of the trench gate type power MISFET, causing the p-type semiconductor region to serve as a punch-through stopper layer of the trench gate type power MISFET.

8 Claims, 19 Drawing Sheets

FOREIGN PATENT DOCUMENTS

| | | |
|---|---|---|
| JP | 2001-127292 | 5/2001 |
| JP | 2001-308329 | 11/2001 |
| JP | 2002-203964 | 7/2002 |
| JP | 2002-533936 A | 10/2002 |
| JP | 2003-174167 | 6/2003 |

\* cited by examiner

SEMICONDUCTOR DEVICE AND A METHOD OF MANUFACTURING THE SAME

CROSS-REFERENCE TO RELATED APPLICATION

This application is a Continuation application of U.S. application Ser. No. 11/657,592 filed Jan. 25, 2007 now abandoned, which is a Continuation application of U.S. application Ser. No. 10/886,041 filed on Jul. 8, 2004 now abandoned. Priority is claimed based on U.S. application Ser. No. 11/657, 592 filed Jan. 25, 2007, which claims priority to U.S. application Ser. No. 10/886,041 filed on Jul. 8, 2004, which claims priority to Japanese Patent Application No. 2003-286142 filed on Aug. 4, 2003, all of which is incorporated by reference.

FIELD OF THE INVENTION

The invention relates to a semiconductor device and for a method of manufacturing the same, and in particular, to a semiconductor device and method employing power MISFETs (Metal Insulator Semiconductor Field Effect Transistors).

BACKGROUND OF THE INVENTION

In the case of a trench (groove) gate type power MOSFET (Metal Oxide Semiconductor Field Effect Transistor) formed in a structure incorporating, for example, a p-type epitaxial layer as an upper layer of an $n^+$type substrate, it is known to reduce the risk of punch-through breakdown of the trench gate by forming an n-type drain region extended between the $n^+$type substrate and the bottom of a trench, and by forming a junction of the n-type drain region and the p-type epitaxial layer extended between the ntype substrate and a partition wall of the trench. This is illustrated in, for example, Japanese Patent Laid-Open No. 2000-164869.

It is also known to improve switching loss of the trench gate power MOSFET by providing an $n^-$type epitaxial layer doped to have a first conductivity type, and a well layer doped to have a second conductivity type, over a semiconductor substrate heavily doped to have the first conductivity type, thereby providing a deep trench gate, isolated by an insulating layer, inside an upper side layer made up of the $n^-$type epitaxial layer and the well layer, and thereby providing a drain region of high conductivity under the trench gate. It is further known to provide source regions heavily doped to have the first conductivity type, adjacent to the trench gate, and to provide a main body region doped more heavily than the well layer, in the upper part of the well layer, to thereby reduce ON-resistance of the drain region. This is illustrated, for example, in Japanese Patent Laid-Open No. 2000-299464.

A power transistor, such as the power MOSFET, may be used for high power applications, such as wherein the power is not less than several watts. One such power transistor, a power MISFET, may be a vertical type and/or a lateral type MISFET, depending on the structure of the gate thereof. A MISFET may be further classified as a trench (groove) gate type, or a planar gate type.

A power MISFET may be used as a switching element of a DC-DC converter, for example, such as for use as a power source circuit for a computer. Since there has recently been a trend of larger current requirements for a CPU (Central Processing Unit) of a computer, to which the DC-DC converter supplies power, a larger current is required of the DC-DC converter as well. Requiring larger currents may cause an increase in ON-loss for a power MISFET. Accordingly, lower ON-resistance also is requited of a power MISFET used in a DC-DC converter.

In a trench gate type power MISFET, a deep groove is formed in a top, element-forming surface of a semiconductor substrate (hereinafter referred to as a substrate), and a gate is formed by embedding a conductor in the groove. Further, in a planar gate type power MISFET, a gate is formed over a top surface of a substrate through the intermediary of a gate insulator. Accordingly, in the trench gate type power MISFET, a current flow path in the substrate becomes shorter as compared with a planar gate type power MISFET, so that ON-resistance can be reduced. However, since a gate insulator is formed on the sidewalls and bottom surface of the groove, there may be an increase in capacitance due to the gate insulator acting as a capacitance insulator, and the gate part acting as a capacitance electrode, as the groove is rendered deeper. On the other hand, in a planar gate type power MISFET, capacitance from the gate insulator acting as the capacitance insulator and the gate acting as the capacitance electrode is reduced as compared with the trench gate type power MISFET, but the number of the gate parts that can be disposed per unit area is reduced if a sufficient gate length to prevent pinch off is present. Hence, if an area of a semiconductor chip, over which the planar gate type power MISFET is formed is constant, the number of the gate parts that can be disposed on the semiconductor chip is less than that in the case of a trench gate type power MISFET. As a result, in the case of the planar gate type power MISFET, ON-resistance of the semiconductor chip increases as compared with the trench gate type power MISFET. Hence, if the trend for the DC-DC converter to higher frequency and larger current continues, the known art cannot simultaneously meet lower ON-resistance and lower capacitance required of a power MISFET.

Thus, the need exists for a semiconductor device and method that provides a power MISFET that simultaneously provides lower ON-resistance and lower capacitance.

SUMMARY OF THE INVENTION

A power MISFET, may include a multitude, such as, for example, several tens of thousands, of finely patterned MISFETs may be connected in parallel. Such a power MISFET may be used as a switching element of a DC-DC converter, for example, such as for use as a power source circuit for a computer, such as a desktop type, note type, server, and the like. Minimization of capacitance for a choke coil, I/O, and so forth, as well as fast response to variation in load, is required of a DC-DC converter. Accordingly, there is a trend for a DC-DC converter towards higher frequency, and as the DC-DC converter operates higher in frequency, an increase in switching loss and drive loss may occur in a power MISFET. Since the switching loss is proportional to a feedback capacitance of a power MISFET, and the drive loss is proportional to an input capacitance, reduction in these capacitances is required for a power MISFET used in a DC-DC converter.

FIG. 33 is an equivalent circuit diagram of the feedback capacitance and input capacitance for a power MISFET. As shown, assuming that capacitance between a gate and a drain is Cgd, capacitance between the gate and a source is Cgs, and capacitance between the drain and the source is Cds, an input capacitance Cin can be expressed as Cin ∝Cgd+Cgs, and a feedback capacitance Cfb can be expressed as Cfb=Cgd.

FIG. 34 illustrates the capacitance between the gate and the source, and the capacitance between the gate and the drain. As shown in FIG. 34, respective voltages applied to a gate electrode GELE, an $n^+$ type semiconductor region NSEM as the source, and an n⁻ type single crystal layer NEPI as the drain, are denoted by VG, VS, and VD, respectively, and it is assumed that the voltage VS is at the same potential as that for the source. Assuming that the voltages VG, VS are 0V, respectively, and the voltage VD is a voltage varying from 0V to 10V at a frequency of 1 MHz under the conditions described, the capacitance between the gate and the source can be expressed as capacitance C1 between the gate electrode GELE and the p⁻ type semiconductor region PBOD, acting as capacitance electrodes, wherein a gate insulator GINS acts as a capacitance insulator. This capacitance C1 may be coupled in series with capacitance C2 between the gate electrode GELE and the p⁻ type semiconductor region PBOD acting as capacitance electrodes, wherein a depletion layer DEP (see FIG. 34, in gray scale) acts as a capacitance insulator. The capacitance between the gate and the drain can be expressed as capacitance C3, with the gate electrode GELE and the n⁻ type single crystal layer NEPI acting as capacitance electrodes, and the gate insulator GINS acting as a capacitance insulator. Capacitance C3 may be coupled in series with capacitance C4, with the gate electrode GELE and the n⁻ type single crystal layer NEPI acting as capacitance electrodes, and the depletion layer DEP acting as a capacitance insulator.

The trench gate type power MISFET shown in FIG. 35 has a trench gate structure wherein grooves 103 are formed in a top surface of an n⁺ type single crystal silicon substrate 101, and in an n⁻ type single crystal silicon layer 102 formed in the upper part thereof. A conductor is embedded in each of the grooves 103 through gate insulator 104, thereby forming a gate 105. In the case of the trench gate structure described, a current flow path in the n⁻ type single crystal silicon layer 102 which is relatively low in impurity concentration can be rendered shorter than that in a planar gate structure, thereby reducing JFET (Junction FET) resistance acting as ON-resistance. Further, a source electrode 106 may be formed to fill each of grooves 108 in the top surface of the substrate and insulating film 107, which source electrode may be electrically connected to a p⁺ type semiconductor region 110 formed in a p⁻ type semiconductor region 109 serving as a channel layer, wherein an n⁺ type semiconductor region 111 serves as a source region. The p⁺ type semiconductor region 110 can be formed by self-aligned implantation of dopant ions from the groove 108 into the substrate, so that mask alignment allowance for implantation of the dopant ions need not be taken into account. Accordingly, because MISFET cell pitches can be scaled down, higher integration of the power MISFETs can be attained, and ON-resistance can be reduced. Furthermore, with the adoption of the trench gate structure, a channel length runs along a depth of the substrate, so as to allow for scale-down of the power MISFET cell pitches as compared with the planar gate type power MISFET (in which a channel length runs along the top surface of the substrate).

However, because the groove 103 having the gate 105 formed therein is at a depth as deep as, for example, about 1 µm, the gate insulator may act as a capacitance insulator and the gate may act as a capacitance electrode. Input capacitance among the capacitance components is proportional to a length of the periphery of the groove 103 (a surface area of the groove 103 under the n⁺ type semiconductor region 111), and feedback capacitance is proportional to a distance D12 of a portion of the groove 103 extending from the p⁻ type semiconductor region 109 toward the n⁻ type single crystal silicon layer 102 (a surface area of the portion of the groove 103, in contact with the n⁻ type single crystal silicon layer 102). Accordingly, narrowing a width of the groove 103 reduces the input capacitance, and reducing the distance D12 of the portion of the groove 103 extending from the p⁻ type semiconductor region 109 toward the n⁻ type single crystal silicon layer 102 (thus rendering the groove shallower) reduces feedback capacitance.

Nonetheless, there are limits to process dimensions for narrowing the width of the groove 103, and if the groove 103 is rendered too narrow, an increase in resistance of the gate 105 results. Furthermore, to render the groove 13 shallower, a junction is needed between the p⁻ type semiconductor region 109 and the n⁻ type single crystal silicon layer 102 at a position correspondingly shallower (shallower junctioning). In the case of such shallower junctioning, when a voltage is applied between the drain and the source, depletion may occurs to the channel layer (the p⁻type semiconductor region 109), thereby causing punch through. for the known art does not allow for the reduction of capacitance by rendering the groove shallower while preventing.

If the impurity concentration of the p⁻ type semiconductor region 109 is raised to prevent depletion from occurring to the channel layer, the threshold voltage of the MISFET may increase, resulting in an increase in ON-resistance. Further, if the p⁻ type semiconductor region 109 has the same depth as that of the groove 103 in order to reduce the distance of the groove 103, the bottom of the groove 103 may be covered by the p⁻type semiconductor region 109 due to manufacturing variation of the groove 103, and the threshold voltage of the MISFET thus increases, thereby resulting in an increase in the ON-resistance.

The present invention achieves lower ON-resistance and lower capacitance for trench gate type power MISFETs. In accordance with an aspect of the invention, there is provided a semiconductor device having MISFETs, including: a first semiconductor layer having a first conductivity type, formed over the top surface of a semiconductor substrate; a second semiconductor layer having a second conductivity type opposite the first conductivity type, formed over the first semiconductor layer; a plurality of first groove parts of not more than 1 µm in depth, formed in the top surface of the semiconductor substrate, wherein at least a portion of respective bottoms of ones of the first groove parts are in contact with the first semiconductor layer; a first insulating film formed on the sidewall and bottom of each of the first groove parts; a first conductor formed over the first insulating film, wherein the first conductor fills up the respective first groove parts; a third semiconductor layer having the first conductivity type, formed in the second semiconductor layer adjacent to respective ones of the first groove parts; a fourth semiconductor layer having the second conductivity type, formed in the second semiconductor layer between adjacent ones of the first groove parts; and a first electrode electrically connected to the third semiconductor layer and the fourth semiconductor layer, wherein the first semiconductor layer and the third semiconductor layer form a source or a drain of each of the MISFETs, the second semiconductor layer forms a channel forming region of each of the MISFETs, and a fifth semiconductor layer having the second conductivity type and higher in impurity concentration than the second semiconductor layer is formed under the third semiconductor layer, in the second semiconductor layer.

The invention provides in an aspect a method of manufacturing a semiconductor device having MISFETs, including the steps of:

(a) forming a first semiconductor layer, having a first conductivity type, over the top surface of a semiconductor substrate;

(b) introducing a dopant having a second conductivity type opposite the first conductivity type into the semiconductor substrate, and forming a second semiconductor layer having the second conductivity type over the first semiconductor layer;
(c) forming a plurality of first groove parts in the top surface of the semiconductor substrate;
(d) forming a first insulating film inside the respective first groove parts;
(e) embedding a first conductor in the respective first groove parts to thereby form a gate electrode;
(f) introducing a dopant having the first conductivity type into the semiconductor substrate to thereby form a third semiconductor layer having the first conductivity type adjacent to the respective first groove parts;
(g) introducing a dopant having the second conductivity type into the semiconductor substrate to thereby form a fifth semiconductor layer having the second conductivity type under the third semiconductor layer and within the second semiconductor layer;
(h) forming a plurality of second groove parts each penetrating through the third semiconductor layer to be disposed between adjacent ones of the gate electrodes;
(i) introducing a dopant having the second conductivity type into the semiconductor substrate from the respective bottoms of the second groove parts to thereby form a fourth semiconductor layer having the second conductivity type in the second semiconductor layer to cover the respective bottoms of the second groove parts; and
(j) filling the second groove parts to thereby form a first electrode electrically connected to the third semiconductor layer and the fourth semiconductor layer, wherein the first groove parts are formed to have a depth not more than 1 μm, and wherein at least part of the respective bottoms of the first groove parts are in contact with the first semiconductor layer, and wherein the fifth semiconductor layer is formed to be higher in impurity concentration than the second semiconductor layer, thereby forming MISFETs that each have the first semiconductor layer and the third semiconductor layer as a source or a drain thereof, and the second semiconductor layer as a channel forming region thereof.

Thus, the present invention provides a semiconductor device and method that provides a power MISFET that simultaneously provides lower ON-resistance and lower capacitance.

BRIEF DESCRIPTION OF THE DRAWINGS

The various features of the present invention will now be described in greater detail with reference to the drawings of aspects of the present invention, and various related elements thereof, wherein like reference numerals designate like elements, and wherein.

DETAILED DESCRIPTION

It is to be understood that the figures and descriptions of the present invention have been simplified to illustrate elements that are relevant for a clear understanding of the present invention, while eliminating, for purposes of clarity, many other elements found in a typical semiconductor device and method. Those of ordinary skill in the art will recognize that other elements are desirable and/or required in order to implement the present invention. But because such elements are well known in the art, and because they do not facilitate a better understanding of the present invention, a discussion of such elements is not provided herein. The disclosure herein is directed to all such variations and modifications to the applications, networks, systems and methods disclosed herein and as will be known, or apparent, to those skilled in the art.

Figure 1:
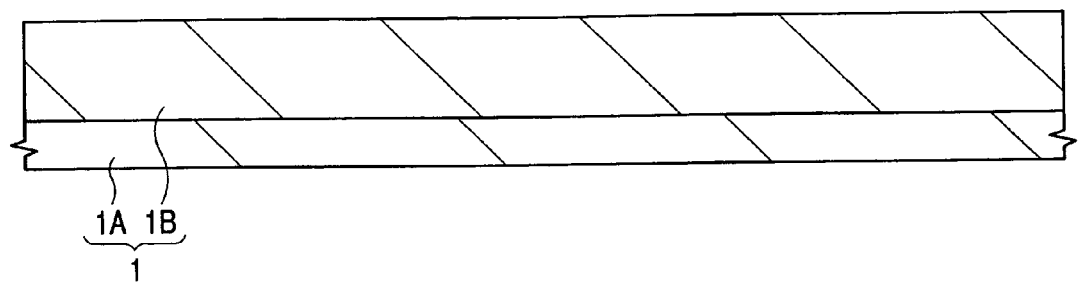
FIG. 1 is a sectional view of a semiconductor device according to the invention.

As shown in FIG. 1, a semiconductor substrate (hereinafter also referred to as a substrate) 1 is provided. An $n^-$ type single crystal silicon layer (a first semiconductor layer) 1B may doped with a dopant {for example p (phosphorus)} having an n-type conductivity to undergo epitaxial growth of an $n^+$ type single crystal silicon substrate 1A having the n-type conductivity (a first conductivity type). An off-angle substrate formed by use of a semiconductor wafer (hereinafter referred to as a first wafer), the (100) face of which is the top surface (an element forming surface), may be used as the base substrate, and a second wafer, the top surface of which is a face, and the normal to which is a straight line tilted by a predetermined angle from the normal to the top surface of the first wafer in the direction of an orientation flat or a notch may be formed in the first wafer. The $n^+$ type single crystal silicon substrate 1A and the $n^-$ type single crystal silicon layer 1B may serve as a drain region for the respective power MISFETs.

Figure 2:
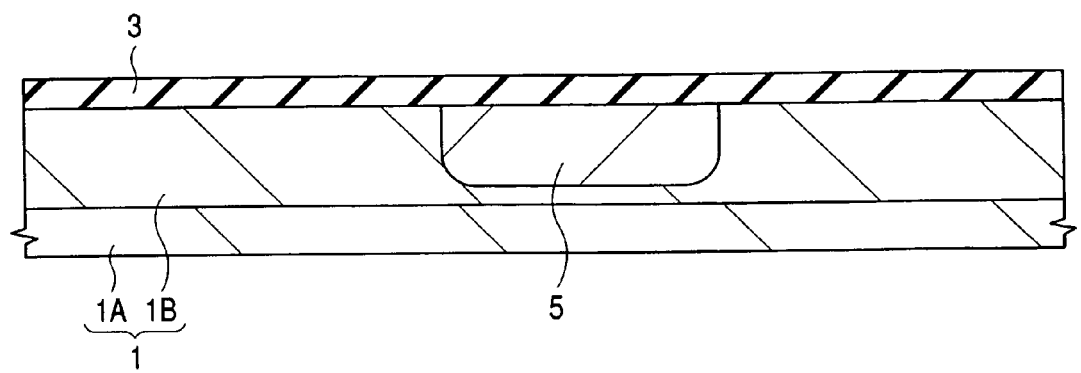
FIG. 2 is a sectional view of a step of manufacturing the semiconductor device, subsequent to a step shown in FIG. 1.

As shown in FIG. 2, a silicon oxide film 3 may be formed by applying, for example, thermal oxidation to a surface (the top surface) of the $n^-$ type single crystal silicon layer 1B. Subsequently, using a silicon nitride film (not shown) patterned on the silicon oxide film 3 by photolithographic techniques, such as a mask, a dopant {for example B (boron)} having a p-type conductivity may be implanted into the substrate 1 and may undergo thermal diffusion, thereby forming a p-type well 5. Thereafter, the silicon nitride film may be removed.

Figure 3:
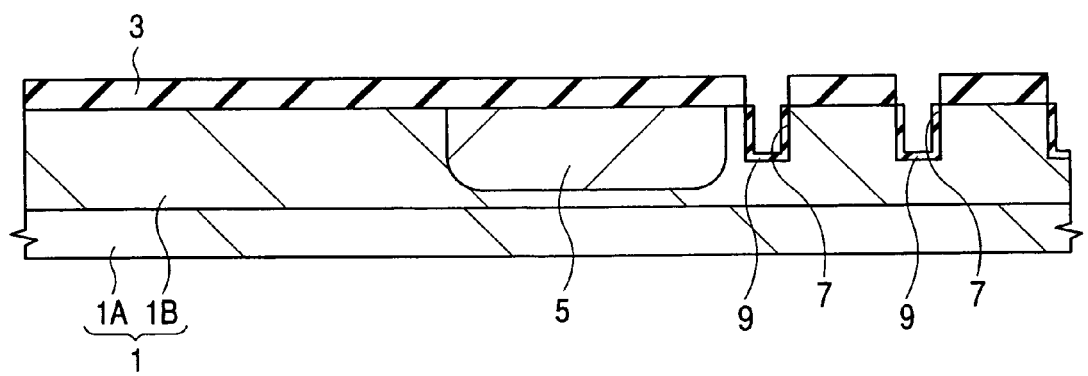
FIG. 3 is a sectional view of a step of manufacturing the semiconductor device, subsequent to the step shown in FIG. 2.

Subsequently, as shown in FIG. 3, grooves 7 may be formed by etching the silicon oxide film 3 and the substrate 1, such as by use of a photo resist film patterned by the photolithographic techniques, such as a mask. The grooves 7 may be formed to have a depth of about 1 μm or less. Further, the grooves 7 may be formed in a shape, such as a square, polygon, or hexagon, extending in a mesh-like pattern, or may be formed in a multitude of stripes extending in substantially the same direction. Subsequently, by applying heat treatment to the substrate 1, a thermal oxidation film (first insulating film) 9 is formed on the bottom and sidewall of each of the grooves 7. The thermal oxidation film 9 may serve as a gate insulator for the respective power MISFETs.

Figure 4:
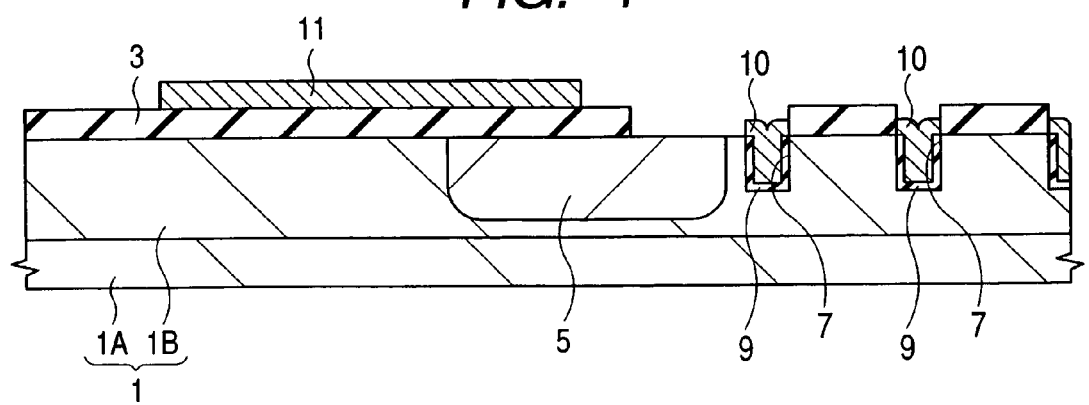
FIG. 4 is a sectional view of a step of manufacturing the semiconductor device, subsequent to the step shown in FIG. 3.

As shown in FIG. 4, a polysilicon film doped with, for example, P, is deposited on the silicon oxide film 3, including on the inside of each of the grooves 7, to thereby fill the respective grooves 7 with the polysilicon film. At this point in time, the polysilicon film layer is formed on a portion of the silicon oxide film 3, over the p-type well 5. Subsequently, by use of a photo resist film patterned by photolithographic techniques as a mask, the polysilicon film is etched so as to leave portions thereof in the grooves 7, thereby forming a gate electrode (first conductor) 10 for the respective power MISFETs inside the respective grooves 7. Also, at this time, a portion of the polysilicon film is left on the silicon oxide film 3, in a peripheral part of a chip region (not shown), thereby forming a polysilicon film pattern 11. The gate electrodes 10 and the polysilicon film pattern 11 are electrically connected to each other in at least one region (not shown in FIG. 4).

Subsequently, by use of a photo resist film patterned by photolithographic techniques as a mask, the silicon oxide film 3 is etched to thereby remove unnecessary portions thereof. By so doing, a region whereat the silicon oxide film 3 is formed that is underneath the polysilicon film pattern 11 becomes an isolation region, and regions defined by the isolation region become element forming regions (active regions).

Figure 5:
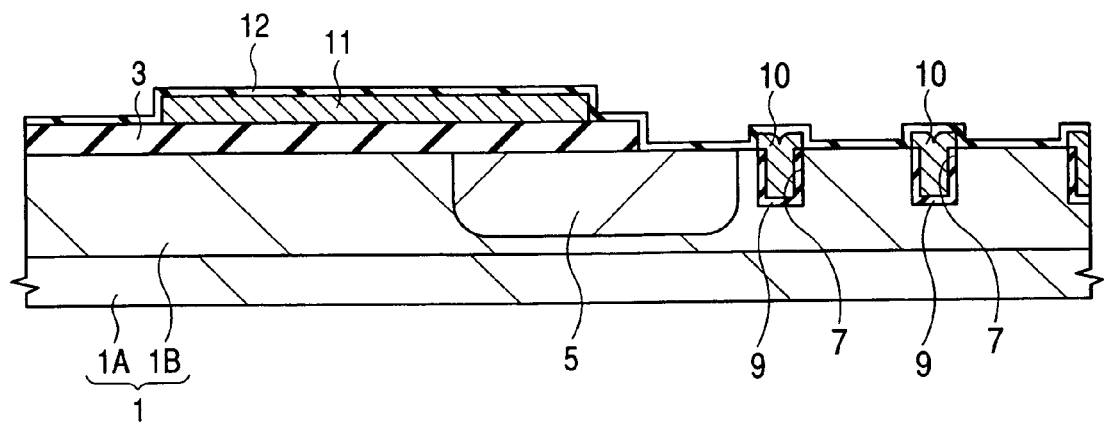
FIG. 5 is a sectional view of a step of manufacturing the semiconductor device, subsequent to the step shown in FIG. 4.
Figure 6:
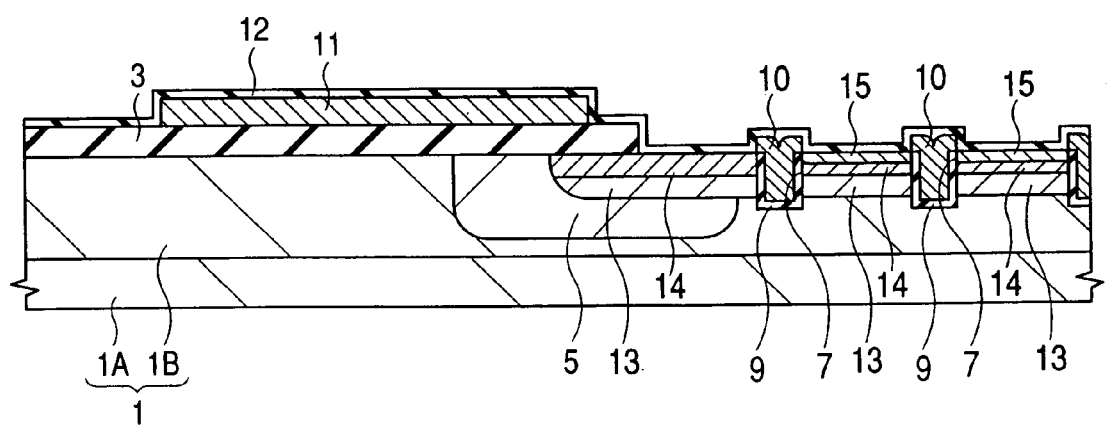
FIG. 6 is a sectional view of a step of manufacturing the semiconductor device, subsequent to the step shown in FIG. 5.

As shown in FIG. 5, a silicon oxide film 12 is deposited over the substrate 1. Subsequently, as shown in FIG. 6, by use of a photo resist film patterned by photolithographic techniques as a mask, dopant ions {for example B (boron)} having a p-type conductivity type, i.e. a second conductivity type different from the first conductivity type, are implanted into the $n^-$ type single crystal silicon layer 1B at a concentration on the order of $5 \times 10^{12}$ ions/cm². Subsequently, by applying heat treatment to the substrate 1, the dopant ions are caused to undergo diffusion, thereby forming a $p^-$type semiconductor region (a second semiconductor layer) 13. At this point in time, the $p^-$type semiconductor region 13 may be formed in such a way as not to cover the respective bottoms of the grooves 7. The $p^-$type semiconductor region 13 may serve as a channel layer for the respective power MISFETs. The $p^-$type semiconductor region 13 may have a depth not less than about 10% shallower than the respective bottoms of the grooves 7. That is, as described above, since the grooves 7 are formed to have a depth of about 10 μm or less, the portion of each of the grooves 7 extending off of the $p^-$type semiconductor region 13 may be kept to a depth of not more than about 0.1 μm.

Subsequently, by use of a photo resist film patterned by photolithographic techniques as a mask, dopant ions (for example B) having the p-type conductivity may be implanted into the $n^-$ type single crystal silicon layer 1B at a concentration in the order of $3 \times 10^{12}$ ions/cm², thereby forming a p-type semiconductor region (fifth semiconductor layer) 14 higher in impurity concentration than the $p^-$type semiconductor region 13. The photo mask uses in patterning the photo resist film at this stage may be reused from the a photo mask used in patterning the photo resist film at the time of forming the $p^-$type semiconductor region 13, for example. By so doing, it becomes unnecessary to prepare a new photo mask for use in the formation of the p-type semiconductor region 14, thus enabling a reduction in manufacturing cost of the semiconductor device. Thereafter, by use of a photo resist film patterned by photolithographic techniques as a mask, dopant ions {for example, As (arsenic)} having the n-type conductivity are implanted into the $n^-$ type single crystal silicon layer 1B. Subsequently, by applying heat treatment to the substrate 1, the dopant ions are caused to undergo diffusion, thereby forming an $n^+$type semiconductor region (a third semiconductor layer) 15 over the p-type semiconductor region 14 inside the $p^-$type semiconductor region 13. Thus are formed respective power MISFETs having the drain region in the $n^+$-type single crystal silicon substrate 1A and the $n^-$ type single crystal silicon layer 1B, and the source region in the $n^+$ type semiconductor region 15. Further, the p-type semiconductor region 14 may serve as a punch-through stopper layer for the respective power MISFETs.

Figure 7:
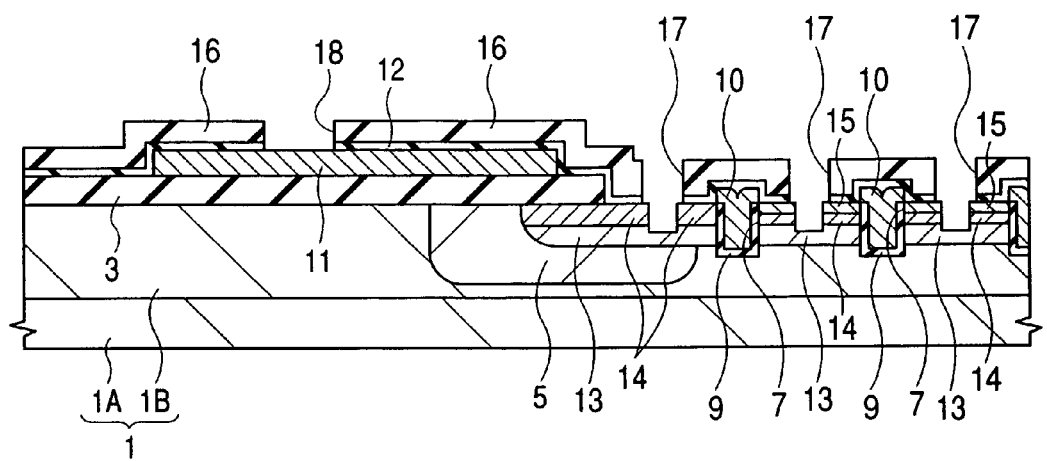
FIG. 7 is a sectional view of a step of manufacturing the semiconductor device, subsequent to the step shown in FIG. 6.

As shown in FIG. 7, for example, a PSG (Phospho-Silicate Glass) film is deposited over the substrate 1, and subsequently an SOG (Spin On Glass) film is applied to the top of the PSG film, thereby forming an insulating film 16 of the PSG film and the SOG film. Subsequently, by use of a photo resist film patterned by photolithographic techniques as a mask, the insulating film 16, the silicon oxide film 12, and the substrate 1 are etched, thereby forming contact grooves (a second groove part) 17. The contact groove 17 is formed between the gate electrodes 10 adjacent to each other so as to penetrate through the $n^+$ type semiconductor region 15 serving as the source region. Further, the insulating film 16 and the silicon oxide film 12 over the polysilicon film pattern 11 are also patterned, thereby forming contact grooves 18 reaching the polysilicon film pattern 11.

Figure 8:
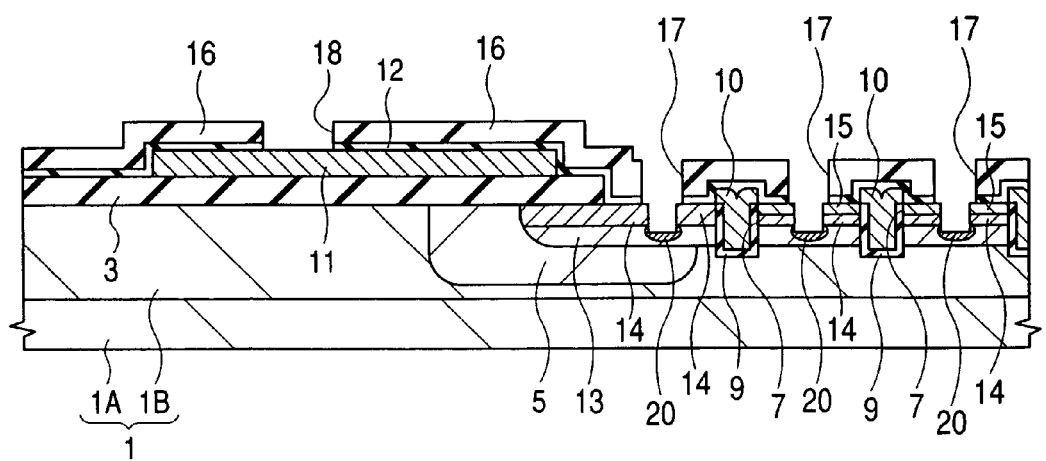
FIG. 8 is a sectional view of a step of manufacturing the semiconductor device, subsequent to the step shown in FIG. 7.

As shown in FIG. 8, $BF_2$ (boron difluoride) ions as dopant ions having the p-type conductivity may be introduced from the bottom of each of the contact grooves 17, thereby forming a $p^+$ type semiconductor region (a fourth semiconductor layer) 20 in such a way as to cover the respective bottoms of the contact grooves 17. Impurity concentration in the $p^+$ type semiconductor region 20 may be rendered higher than that in the p-type semiconductor region 14. Thus, by forming the contact grooves 17 as above, and introducing the dopant ions from the contact grooves 17 using the insulating film 16 as a mask, the $p^+$ type semiconductor region 20 is formed in a self-aligned fashion on the respective bottoms of the contact grooves 17, so that, for example, allowance for mask alignment can be reduced, thereby enabling spacing between the gate electrodes 10 adjacent to each other to be minimized. The $p^+$ type semiconductor region 20 may cause interconnects formed in later steps of this exemplary process to come in ohmic contact with the $p^-$ type semiconductor region 13 at the respective bottoms of the contact grooves 17.

Figure 9:
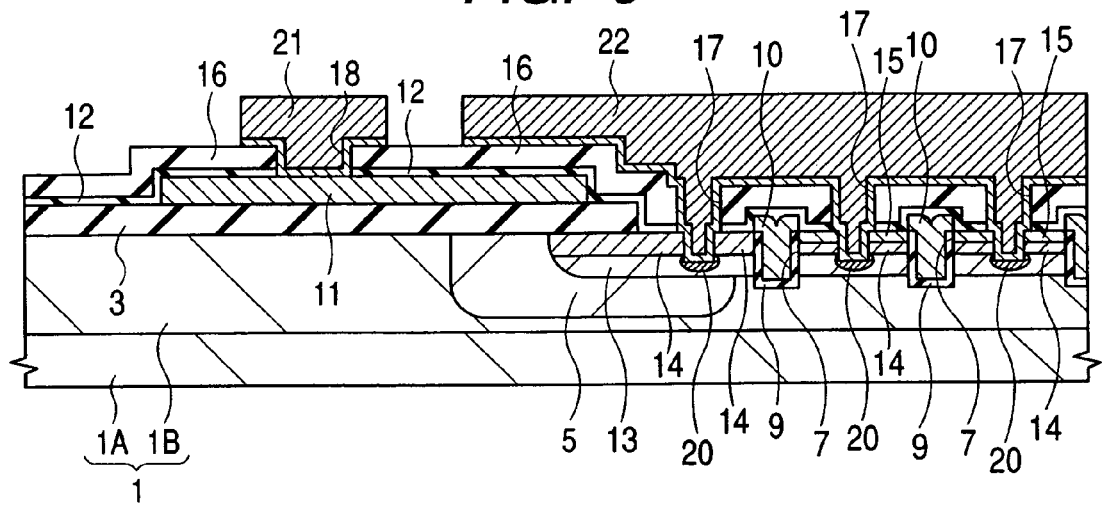
FIG. 9 is a sectional view of a step of manufacturing the semiconductor device, subsequent to the step shown in FIG. 8.
Figure 10:
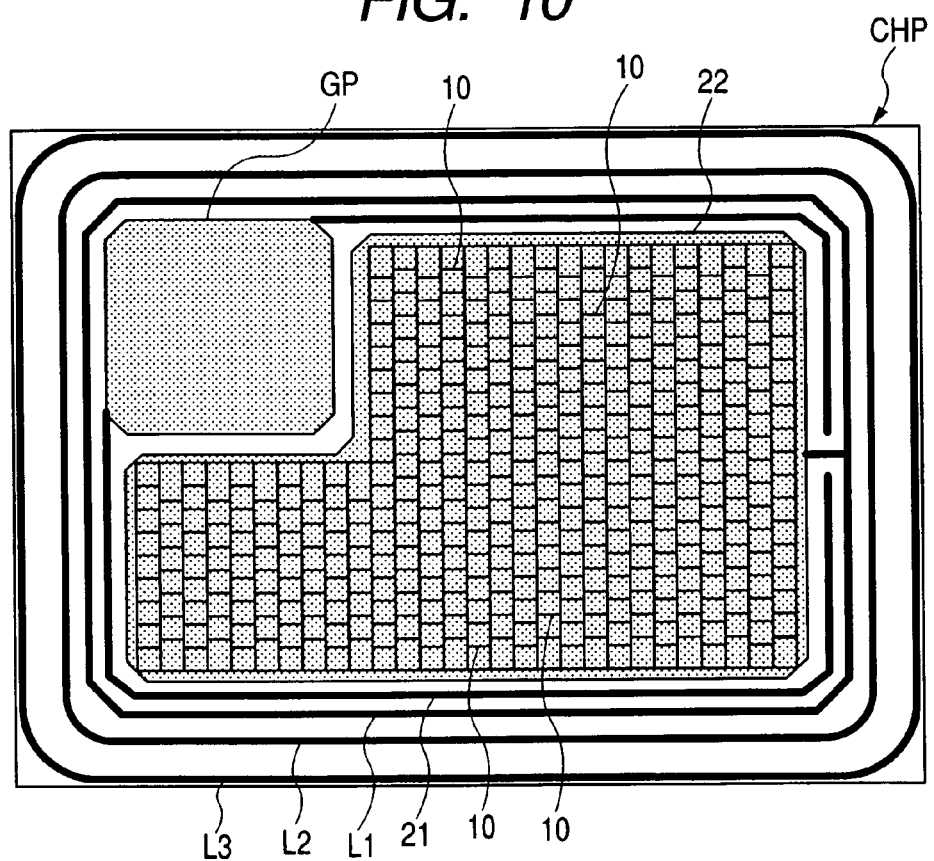
FIG. 10 is a plan view of a step of manufacturing the semiconductor device.
Figure 11:
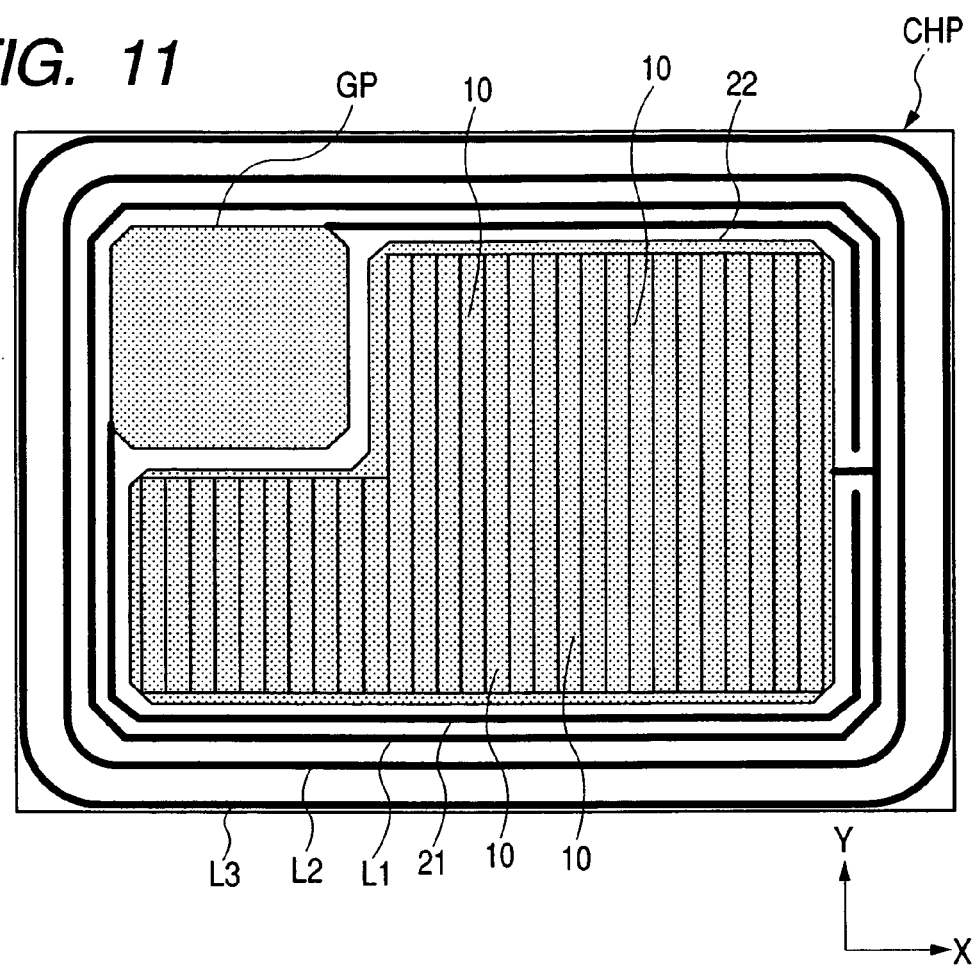
FIG. 11 is a plan view of a step of manufacturing the semiconductor device.

As shown in FIGS. 9 to 11, after thinly depositing a TiW (titanium-tungsten) film serving as a barrier conductor film in the upper part of the insulating film 16, including the inside of each of the contact grooves 17 as well as the inside of each of the contact grooves 18, by, for example, sputtering, heat treatment is applied to the substrate 1. Subsequently, an Al (aluminum) film (a second conductor) lower in resistivity than the polysilicon film for forming the gate electrodes 10 may be deposited on top of the TiW film by, for example, sputtering. The barrier conductor film, in part, prevents an undesirable reactive layer from being formed due to Al contacting with the substrate (Si). As discussed hereinabove, "the Al film" includes Al as the main constituent, and may contain other metals as will be apparent to those skilled in the art.

Subsequently, by use of a photo resist film patterned by photolithographic techniques as a mask, the TiW film and the Al film may be etched, thereby forming a gate interconnect (second electrode, a first part) 21 electrically connected to the gate electrodes 10, a source pad (a first electrode) 22 electrically connected to the $n^+$ type semiconductor region 15 serving as the source region for the respective power MISFETs, a gate pad GP electrically connected to the gate interconnect 21, and interconnects L1, L2, and L3, electrically connected to the source pad 22. FIGS. 10 and 11 show a chip region CHP corresponding to one chip obtained when the substrate 1 is divided into individual chips in a manufacturing step. FIG. 10 exhibits a case of the respective gate electrodes 10 being formed in the shape of a square and arranged in a mesh-like pattern, and FIG. 11 exhibits a case of the respective gate electrodes 10 being formed in a stripe-like pattern.

Figure 12:
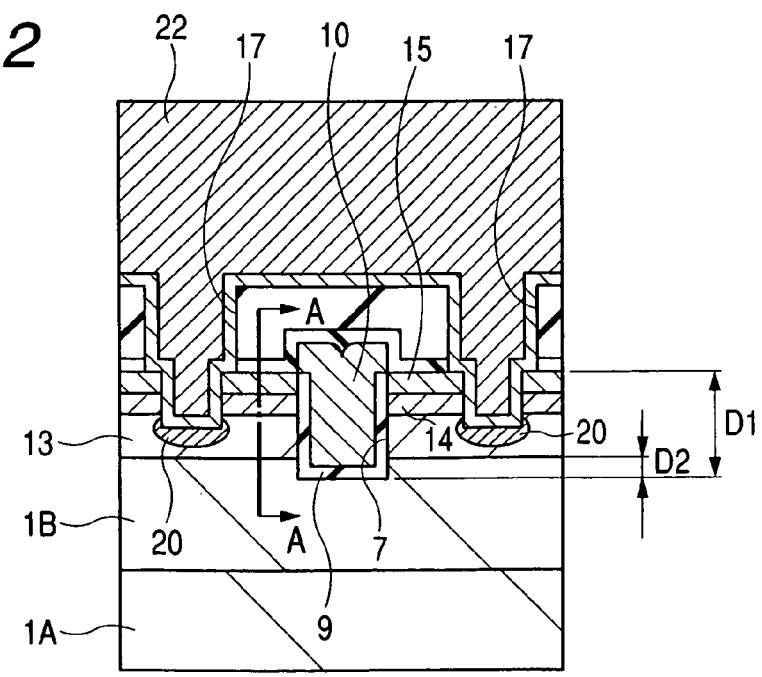
FIG. 12 is an expanded sectional view of a step of manufacturing the semiconductor device.
Figure 13:
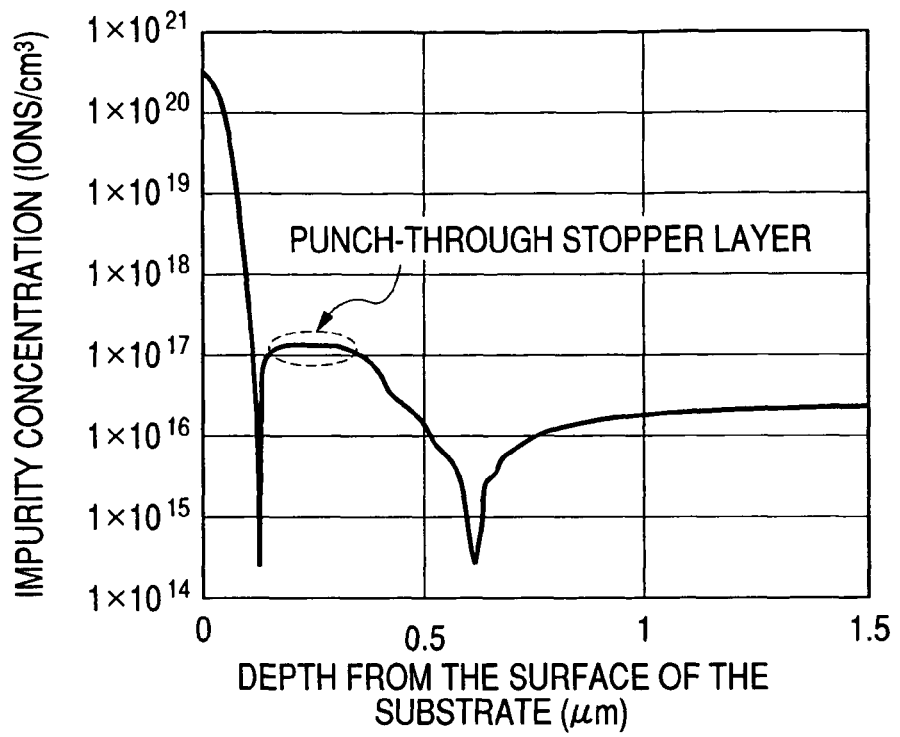
FIG. 13 is a schematic representation showing a depth from the surface of a substrate and impurity concentration, at a position along a line A-A in FIG. 12.

FIG. 12 is an expanded sectional view showing the vicinity of the gate electrode 10. FIG. 13 is a schematic representation showing relationship between a depth from the surface of the substrate 1, and an impurity concentration at a position along a line A-A in FIG. 12.

As discussed hereinabove, the grooves 7 may be formed to have a depth D1 as shallow as about 1 μm or less. By rendering the grooves 7 shallower, it is possible to reduce an input capacitance among capacitive components in a gate insulator (thermal oxidation film 9) that cause the gate insulator to act as a capacitance insulator and the gate electrodes 10 to act as capacitance electrodes. In the case of the gate electrodes 10 acting as capacitance electrodes and the gate insulator (thermal oxidation film 9) acting as the capacitance insulator, a gate capacitance can be rendered to be not more than about $1 \times 10^{-3}$ pF per 1 μm in a direction in which the gate electrodes 10 (grooves 7) extend in a given plane, if a voltage of 0V is applied to the gate electrodes 10 and the source region (the $n^+$ type semiconductor region 15), while a voltage varying from 0V to 10V at a frequency of 1 MHz is applied to the drain region (the $n^+$ type single crystal silicon substrate 1A and the $n^-$ type single crystal silicon layer 1B). For example, if the gate electrodes 10 (grooves 7) are formed in the stripe-like pattern shown in FIG. 11, and assuming that a direction from side to side on the plane of the figure is an x-direction, and a direction from the top to the bottom of the illustration is a y-direction, a direction (first direction) in which the gate electrodes 10 (grooves 7) are extended in a plane can be defined as the y-direction.

In conjunction with rendering the grooves 7 shallower, the $p^-$ type semiconductor region 13 may be formed at a shallow depth and a junction of the $p^-$ type semiconductor region 13 and the $n^-$ type single crystal silicon layer 1 may be set at a shallow position (shallower junctioning). In the case of such shallower junctioning, however, when a voltage is applied between the drain and the source, depletion may occur to the channel layer (the $p^-$ type semiconductor region 13) for the respective power MISFETs, resulting in punch through. If the impurity concentration of the $p^-$ type semiconductor region 13 is raised in order to prevent the depletion from occurring to the channel layer, the threshold voltage of the power MISFET may become higher, resulting in an increase in the ON-resistance. Accordingly, the p-type semiconductor region 14 may be locally higher in impurity concentration than the $p^-$ type semiconductor region 13, and is formed inside the $p^-$type semiconductor region 13 without raising the impurity concentration of the $p^-$ type semiconductor region 13, thereby causing the p-type semiconductor region 14 to function as a punch-through stopper layer. By so doing, the occurrence of punch through can be prevented, as can be a rise in threshold voltage and an increase in the ON-resistance. In other words, reduction of the input capacitance can be implemented while preventing the occurrence of punch through. The threshold voltage can be held to not higher than about 2V.

The sum of a dopant dose for the formation of the $p^-$ type semiconductor region 13, and a dopant dose for the formation of the p-type semiconductor region 14, may be rendered similar in magnitude as compared to a dopant dose for the formation of the $p^-$ type semiconductor region 13 in the first case of a power MISFET with grooves 7 having a depth of about 1 μm or more, and without a punch-through stopper layer (the p-type semiconductor region 14). As a result, the dopant dose for the formation of the $p^-$ type semiconductor region 13 may be reduced as compared with that in the first case power MISFET. Furthermore, as compared with the first case power MISFET, the groove 7 may become shallower in depth, so that in heat treatment after dopant implantation for the formation of the p⁻type semiconductor region 13, applied in order to form the p⁻type semiconductor region 13 in such a way as not to cover the bottom of the groove 7, and to implement the shallower junctioning of the p⁻type semiconductor region 13 and the n⁻ type single crystal silicon layer 1B, a treatment temperature may be lowered. The treatment time may be shortened as compared with that in the manufacturing process for the first case power MISFET. Further, the p-type semiconductor region 14 serving as the punch-through stopper layer is may be formed after the heat treatment for the formation of the p⁻type semiconductor region 13. By so doing, time for heat treatment applied to the substrate 1 after dopant implantation for the formation of the p-type semiconductor region 14 can be shortened, so that localized formation of the p-type semiconductor region 14 inside the p⁻type semiconductor region 13 becomes possible. Still further, as for the n⁺ type semiconductor region 15 serving as the source region of the power MISFET, during heat treatment applied after dopant implantation for the formation of the n⁺ type semiconductor region 15, treatment time is may be shortened as much as possible in order to form the same at a shallow depth, and adoption of a short heat treatment time, such as, for example, by a lamp anneal treatment, may occur.

Further, by forming the groove 7 at a shallower depth, manufacturing variation in depth can be reduced, so that a distance D2 of a portion of the groove 7, extending from the p⁻ type semiconductor region 13 toward with the n⁻type single crystal silicon layer 1B, can be reduced. That is, among the capacitance components in the gate insulator (the thermal oxidation film 9) acting as a capacitance insulator, and the gate electrodes 10 acting as the capacitance electrodes, a feedback capacitance is proportional to the distance of the portion of the groove 7 extending from the p⁻type semiconductor region 13 toward with the n⁻ type single crystal silicon layer 1B. Accordingly, as a result of reduction in the distance of the portion of the groove 7 extending from the lower edge of the p⁻type semiconductor region toward with the n⁻ type single crystal silicon layer 1B, the feedback capacitance can be reduced.

With regard to the p⁻ type semiconductor region 13, the region 13 is designed so as to have a depth shallower by, for example, not less than about 10% of the respective depths of the grooves 7, in order to prevent the p⁻type semiconductor region 13 from covering the bottoms of the grooves 7. However, since the grooves 7 are to have a depth about 1 μm or less, the distance D2 of the portion of the groove 7, extending from the p⁻ type semiconductor region 13 toward the n⁻type single crystal silicon layer 1B, can be rendered not more than about 0.1 μm.

In addition, as a result of the formation of the p-type semiconductor region 14, it becomes possible to reduce base resistance of a parasitic npn bipolar transistor developed by the n⁻ type single crystal silicon layer 1B acting as a collector, the p⁻type semiconductor region 13 acting as a base, and the n⁺ type semiconductor region 15 acting as an emitter. Accordingly, avalanche yield strength of the power MISFET can be enhanced.

Figure 14:
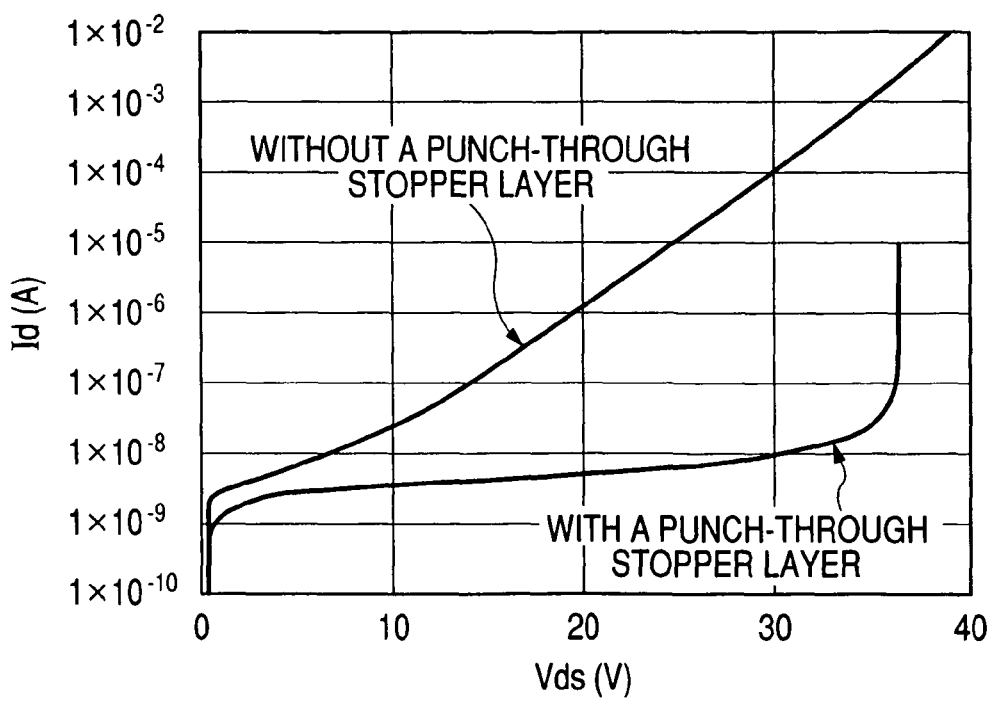
FIG. 14 is a schematic representation showing a source-drain voltage and a drain current for each of power MISFETs in the semiconductor device provided with a punch-through stopper layer, and without the punch-through stopper layer.

Experimentation has been performed to examine occurrence of punch through in the p⁻ type semiconductor region 13 serving as the channel layer in the case wherein the p-type semiconductor region 14 serves as the punch-through stopper layer. FIG. 14 shows a source-drain voltage Vds, and a drain current Id, of the power MISFETs in the case wherein the p-type semiconductor region 14 is provided, and in the case wherein the p-type semiconductor region 14 is not provided. As shown in FIG. 14, it is evident that, in the case wherein the p-type semiconductor region 14 is not provided, punch through occurs to the p⁻type semiconductor region 13 and leak current increases as compared with the case wherein the p-type semiconductor region 14 is provided. More specifically, even in the case of setting the junction of the p⁻ type semiconductor region 13 and the n⁻type single crystal silicon layer 1B at a shallow position (shallower junctioning), by providing the power MISFET with the p-type semiconductor region 14 it is possible to prevent the occurrence of punch through due to depletion occurring to the channel layer (the p⁻type semiconductor region 13) when a voltage is applied between the drain and the source.

Figure 15:
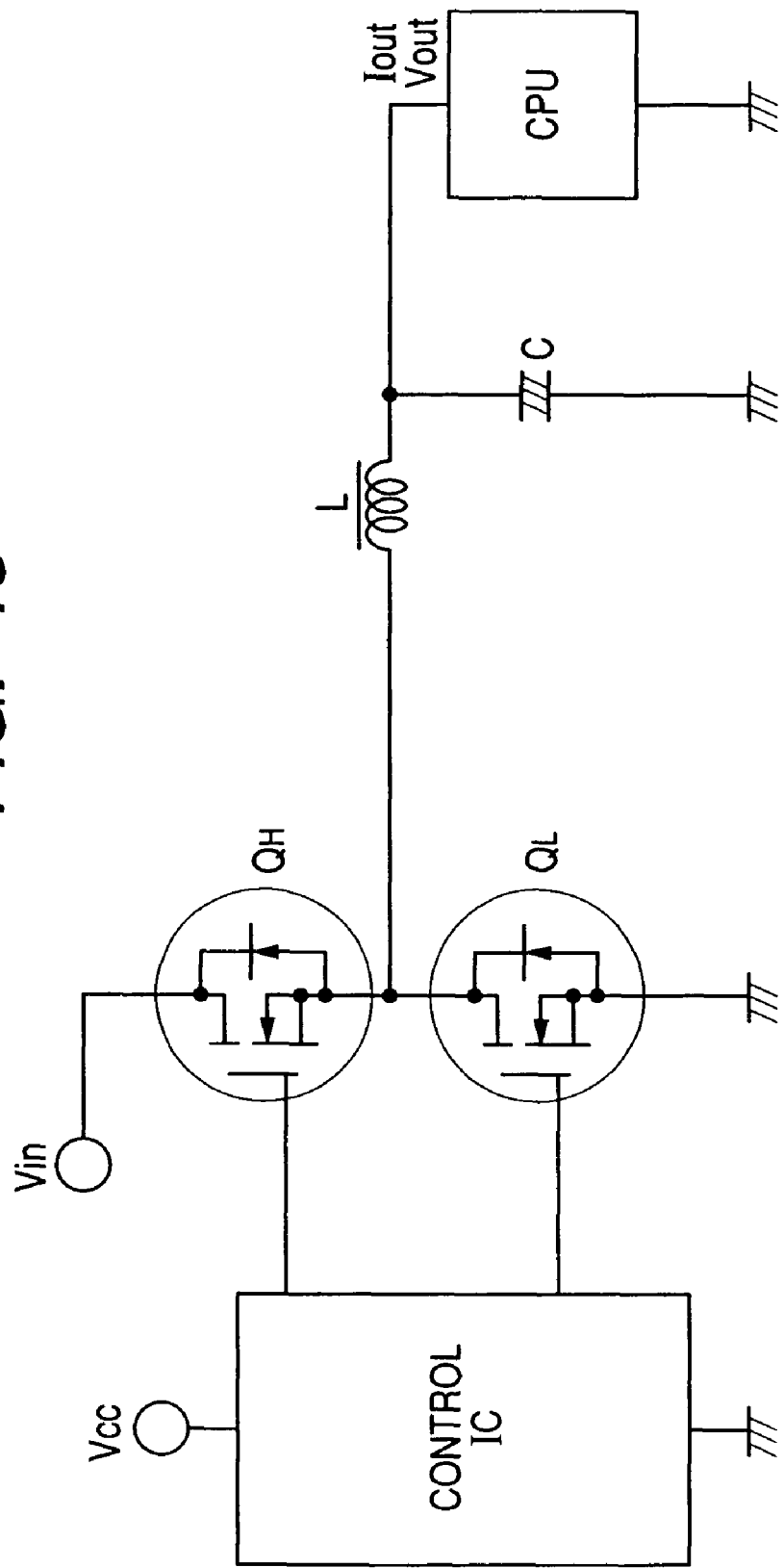
FIG. 15 is a circuit diagram of a DC-DC converter including the semiconductor device.
Figure 16:
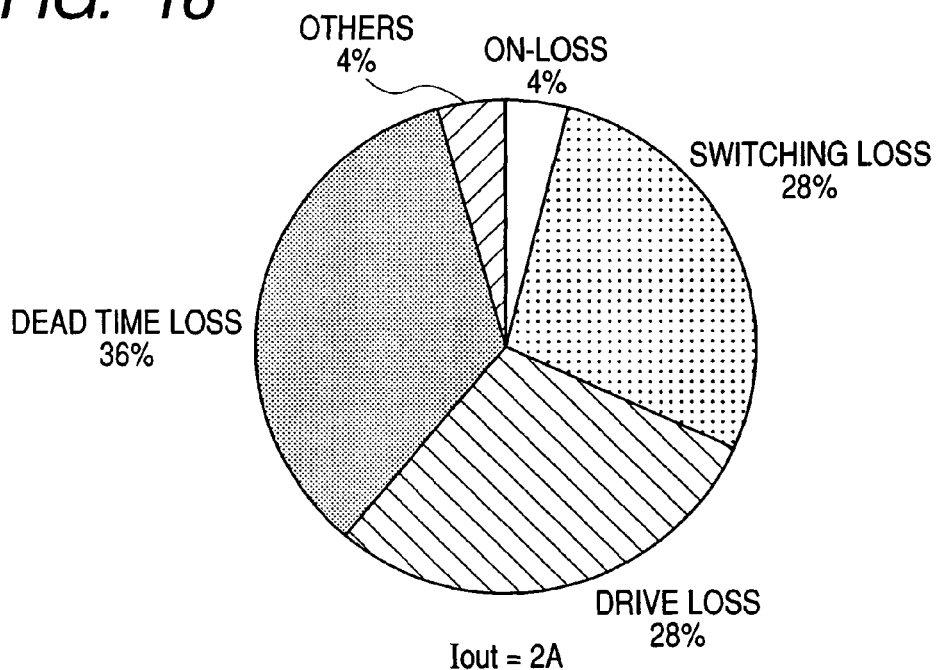
FIG. 16 is a schematic illustration showing breakdown of components in the DC-DC converter shown in FIG. 15.
Figure 17:
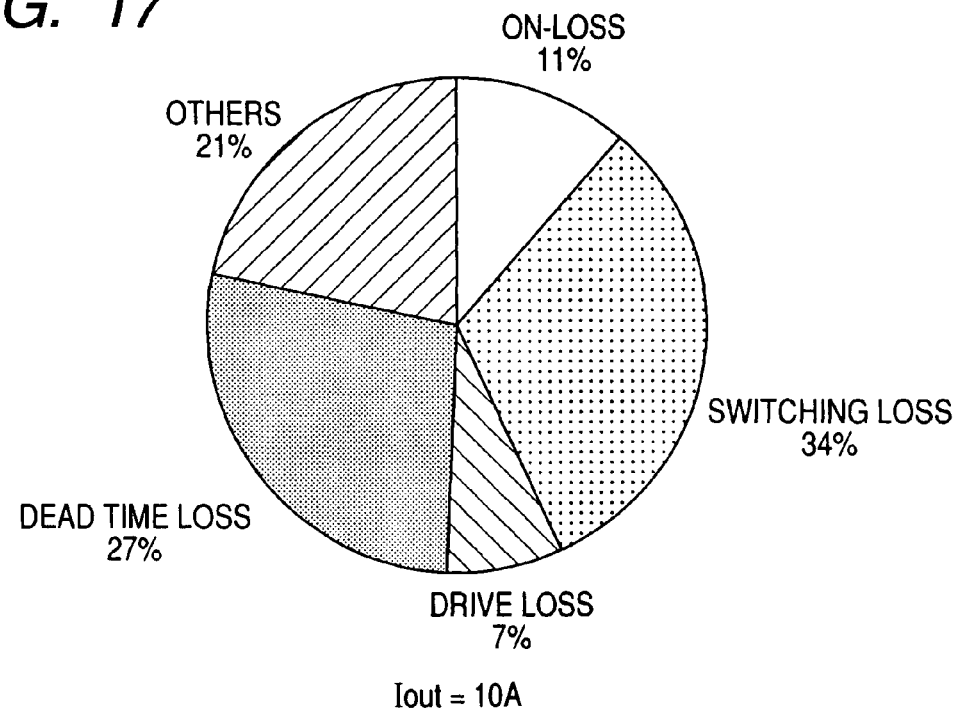
FIG. 17 is a schematic illustration showing breakdown of components in the DC-DC converter shown in FIG. 15.

The power MISFETs may be used as switching elements (High-side MISFETQ$_H$ and Low-side MISFETQ$_L$) in, for example, a DC-DC converter circuit, as shown in FIG. 15. A component analyses on the total loss of the DC-DC converter has been performed by a simulation to examine the breakdown of components. In a simulation condition of an input voltage Vin at 12V, an output voltage Vout at 1.3V, and a circuit operation frequency at 1 MHz, output current Iout at 2A and 10A, respectively, were analyzed. FIGS. 16 and 17 show breakdown of components and the total loss of the DC-DC converter at output current Iout at 2A and 10A, respectively. As show in FIGS. 16 and 17, the sum of a switching loss and a drive loss occupies about 56% of the total loss of the DC-DC converter at output current Iout at 2A, and about 41% of the same at output current Iout at 10A. Herein, the switching loss refers to a loss occurring when the power MISFET is turned ON or OFF, and the drive loss refers to power required for driving the power MISFET. Assuming that a drain-source voltage of the power MISFET is Vds, a drain current is Id, ON-time is tr, OFF-time is tf, an input gate capacitance is Qg, a gate-source voltage is Vgs, and a circuit operation frequency is f, a switching loss can be expressed as:

$$\tfrac{1}{2} \times (tr+tf) \times Id \times Vds \times f,$$

and a drive loss can be expressed as:

$$Qg \times Vgs \times f.$$

Based on these formulae, the switching loss and the drive loss are proportional to a frequency, such that the switching loss and the drive loss increase as the circuit operation frequency becomes higher. Further, the switching loss is proportional to the feedback capacitance of the power MISFET, and the drive loss is proportional to the input capacitance of the power MISFET. As previously described, since the feedback capacitance as well as the input capacitance of the power MISFET can be reduced, the loss of the DC-DC converter can be significantly reduced. Thus, it is possible to implement a higher efficiency DC-DC converter system through the use of the present invention.

Figure 18:
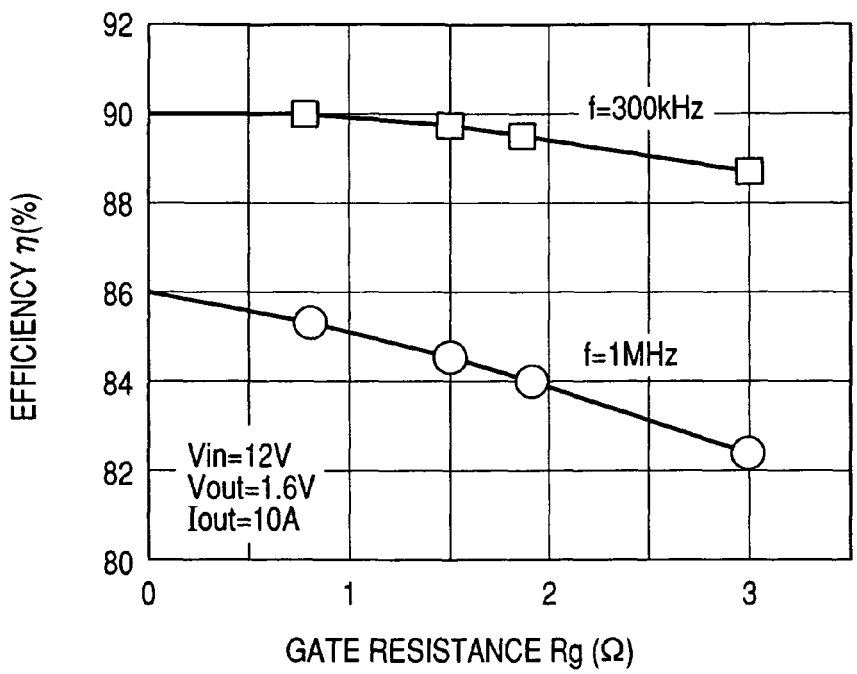
FIG. 18 is a schematic representation showing a gate resistance Rg of each of the power MISFETs in the DC-DC converter shown in FIG. 15 and efficiency η of a DC-DC converter system.

However, if the grooves 7 (refer to FIG. 9) are rendered shallower, a cross sectional area of each of the gate electrodes 10 becomes smaller, so that there arises an increase in gate resistance. FIG. 18 is a schematic representation showing the relationship between a gate resistance Rg of each of the power MISFETs in the DC-DC converter shown in FIG. 15, and efficiency η of the DC-DC converter system. Results shown in FIG. 18 were obtained for circuit operation frequencies of 300 kHz and 1 MHz, respectively, when the input voltage Vin was at 12V, the output voltage Vout at 1.3V, and the output current at 10A. As shown in FIG. 18, with the DC-DC converter shown in FIG. 15, as the gate resistance Rg increases, the efficiency η of the DC-DC converter system deteriorates, and in particular, the higher the circuit operation frequency becomes, the greater the efficiency η of the DC-DC converter system deteriorates.

Figure 19:
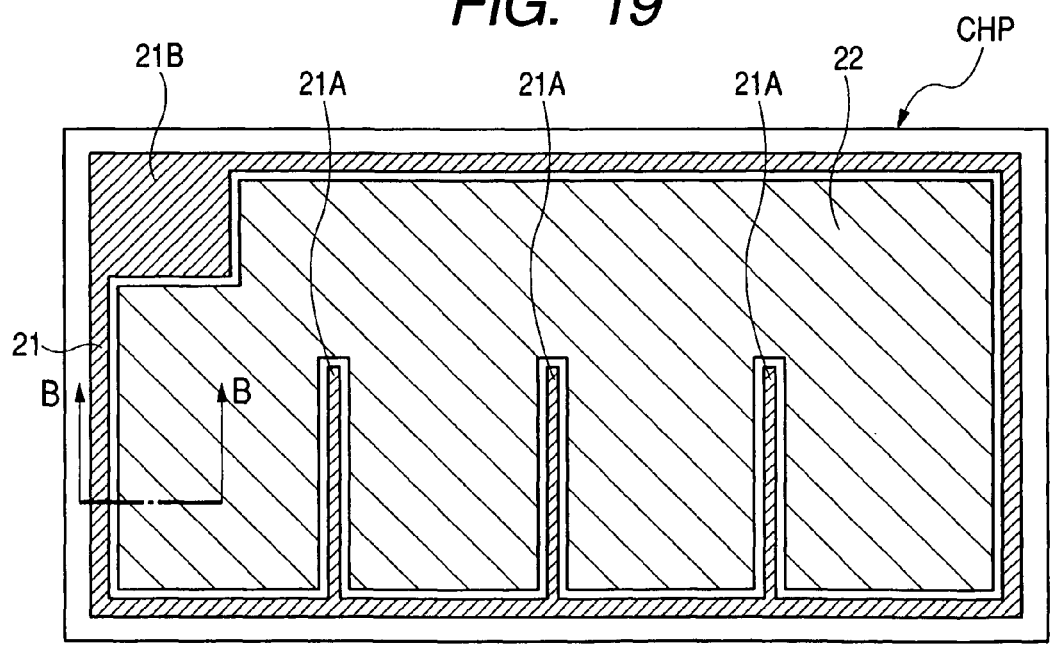
FIG. 19 is a plan view of the semiconductor device.

For this reason, a "gate finger" structure, as shown in FIG. 19, may be adopted. More specifically, a gate finger part (the second electrode, a second part) 21A, formed integrally with the gate interconnect 21 formed along the periphery of the chip region CHP, may be provided. Further, a gate interconnect 21B may be formed integrally with both the gate interconnect 21 and the gate finger part 21A. The gate finger part 21A may be extended from the gate interconnect 21 toward the inner side of the chip region CHP, in a plane, and under the gate finger part 21A, the polysilicon film pattern 11 (refer to FIG. 9), which is electrically connected to the gate electrodes 10, is disposed. Further, as with the gate interconnect 21, the gate finger part 21A is formed so as to fill up the contact grooves 18 (refer to FIG. 9). Since the gate finger part 21A is formed integrally with the gate interconnect 21, the gate finger part 21A becomes a metal interconnect having the Al film as the main conductor layer. By providing the gate finger part 21A as described, the gate finger part 21A has lower resistivity than the polysilicon film pattern 11, and is extended over the polysilicon film pattern 11, rather than extending the polysilicon film pattern 11 under the gate interconnect 21. As a result, the gate resistance Rg can be reduced as compared with extending the polysilicon film pattern 11 under the gate interconnect 21. In FIG. 19, a section taken along line B-B corresponds to a sectional view shown in FIG. 9.

Figure 20:
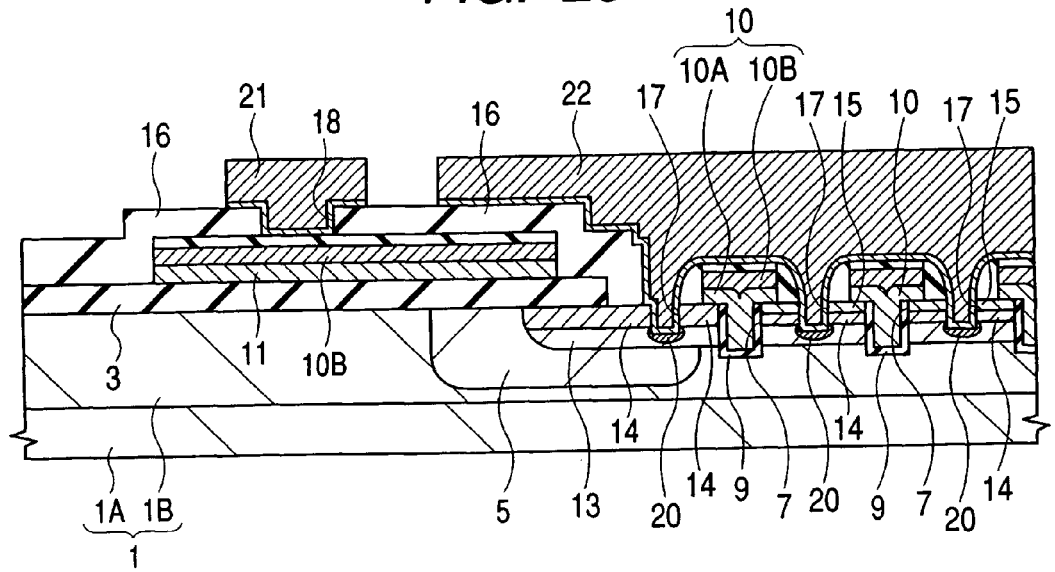
FIG. 20 is a sectional view of the semiconductor device.
Figure 21:
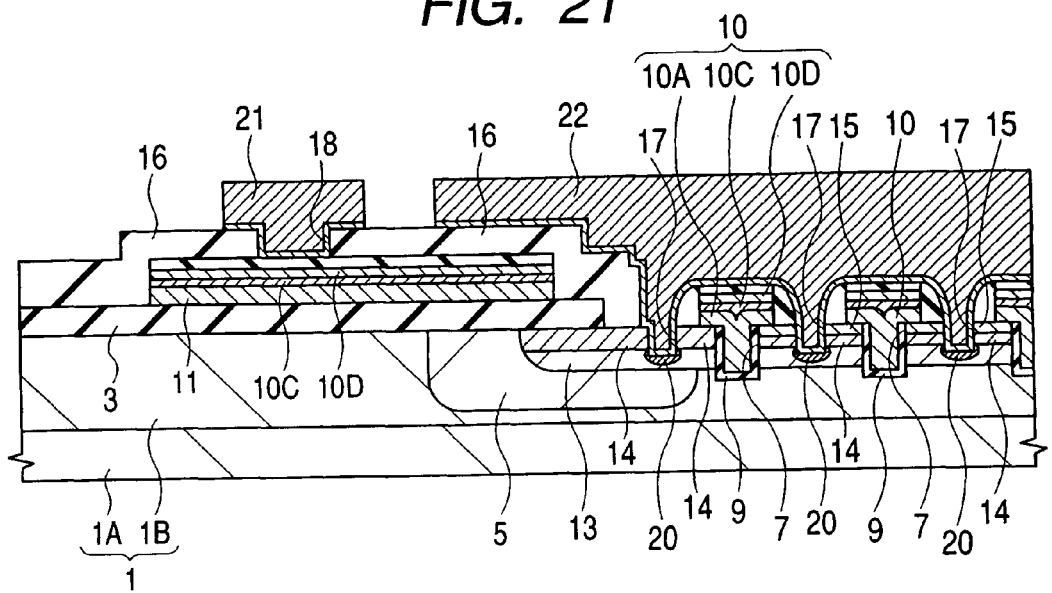
FIG. 21 is a sectional view the semiconductor device

As shown in FIGS. 20 and 21, for the gate electrodes 10, a structure (FIG. 20) of a silicide layer (silicon compound film) 10B, such as a tungsten silicide layer, deposited on top of a polysilicon layer 10A, or a structure (FIG. 21) of a tungsten nitride layer (metal film) 10C, and a tungsten layer (metal film) 10D, sequentially deposited on top of the polysilicon layer 10A, may be adopted. By adopting such structures for the gate electrodes 10, resistivity of the gate electrodes 10 can be reduced as compared with an embodiment wherein the gate electrodes 10 are formed of the polysilicon layer only, and thereby the gate resistance can be further reduced. Further, since the gate electrodes 10 and the polysilicon film pattern 11 may be formed in the same manufacturing step, the silicide layer 10B, or a stacked film of the tungsten nitride layer 10C and the tungsten layer 10D, may be formed over the polysilicon film pattern 11.

The localized formation of the p-type semiconductor region 14 may be implemented in the p$^-$type semiconductor region 13, as discussed hereinthroughout. Because the heat treatment time for the formation of the p-type semiconductor region 14 may be short in duration, a formation position of the p-type semiconductor region 14, and a peak impurity concentration, may be decided by implantation energies for B ions as dopant ions. Accordingly, concentration distribution must be closely monitored, due to channeling of the B ions. Since the B ions are small in atomic radius, there is a particular concern in this regard with respect to the B ions.

Hence, as described with reference to FIG. 1, an off-angle substrate may be used as the substrate 1. The off-angle substrate is described hereinafter with reference to FIGS. 22 and 23. FIG. 23 is a sectional view taken on line C-C in FIG. 22.

Figure 22:
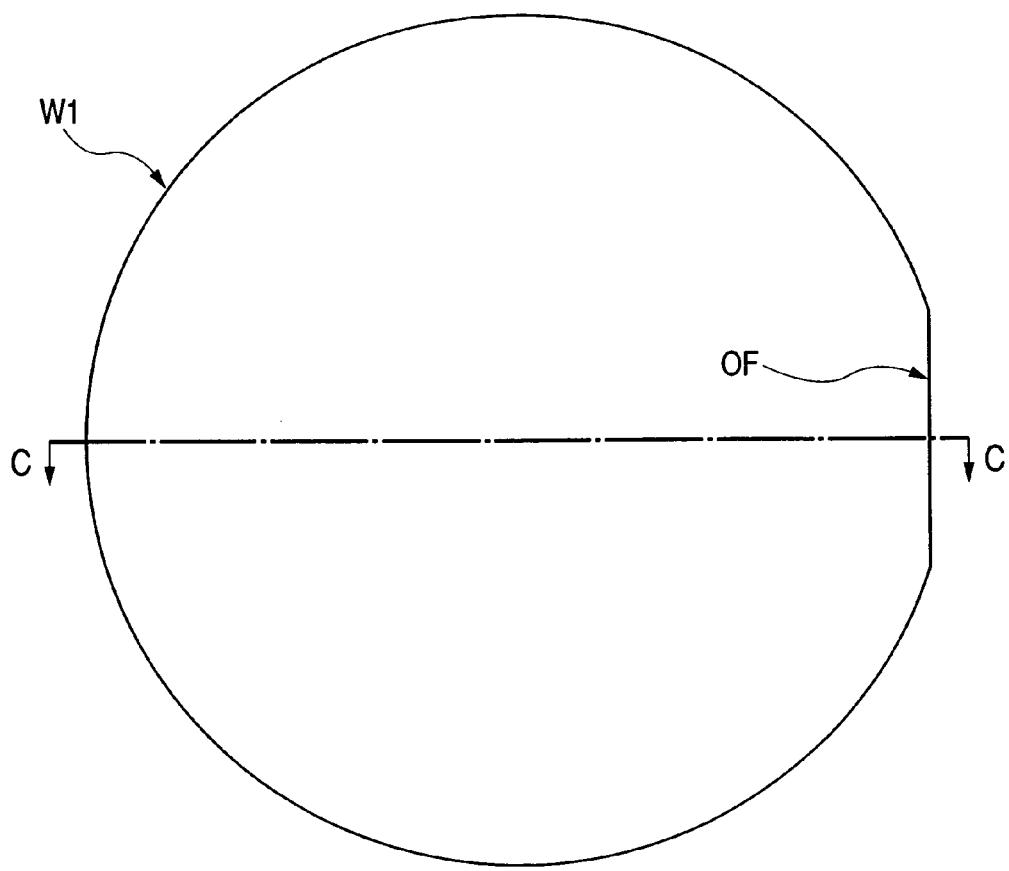
FIG. 22 is a plan view of an off-angle substrate.
Figure 23:
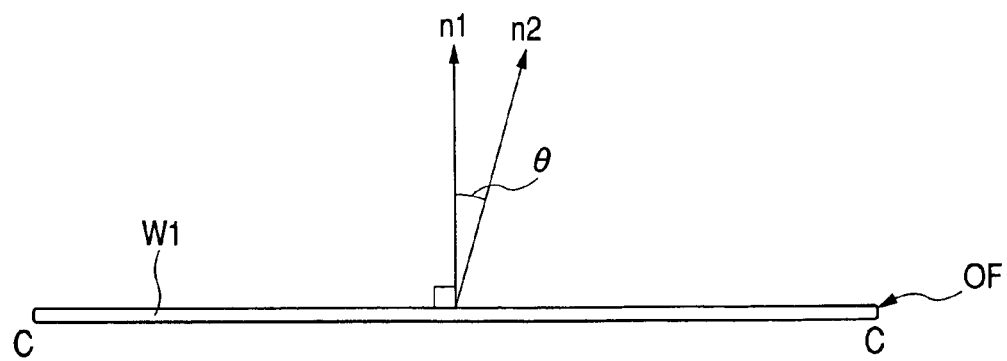
FIG. 23 is a sectional view on line C-C in FIG. 22.

As shown in FIGS. 22 and 23, the first wafer W1 (100) face is the top surface (element forming surface), and the normal to the top surface is designated as n1. A straight line tiled by an angle (a first angle) θ from the normal n1 in a direction toward an orientation OF is designated as n2. The second wafer having the top surface, the normal to which is the straight line n2, is the off-angle substrate. The angle θ may be set to about 4°, by way of example.

Figure 24:
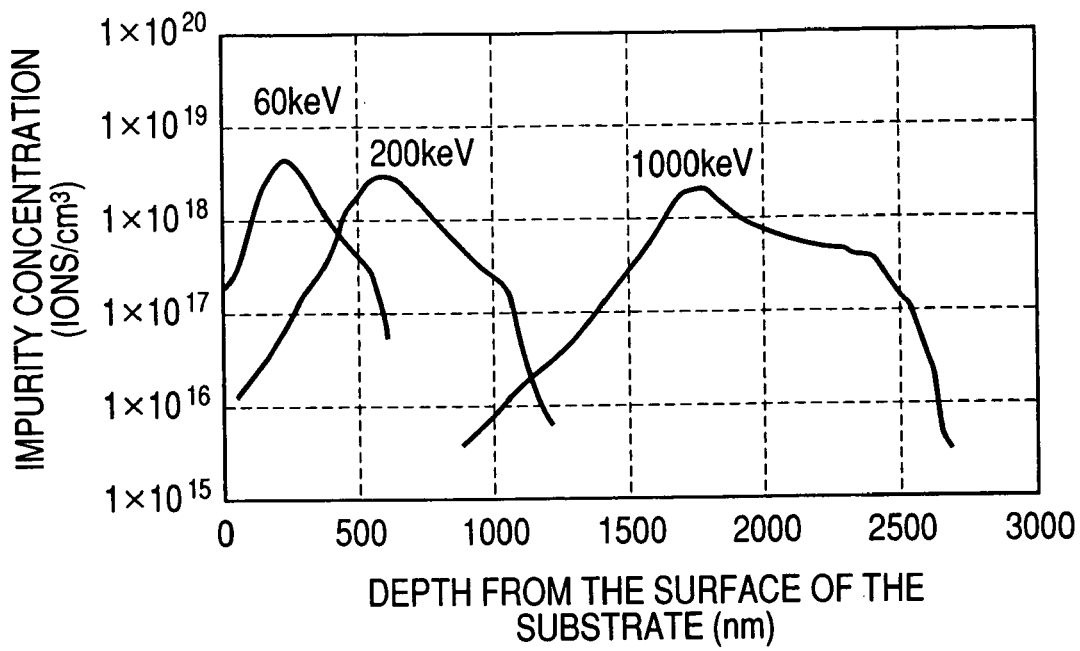
FIG. 24 is a schematic representation showing a depth from the surface of a substrate and impurity concentration distribution when dopant ions are implanted into the substrate.
Figure 25:
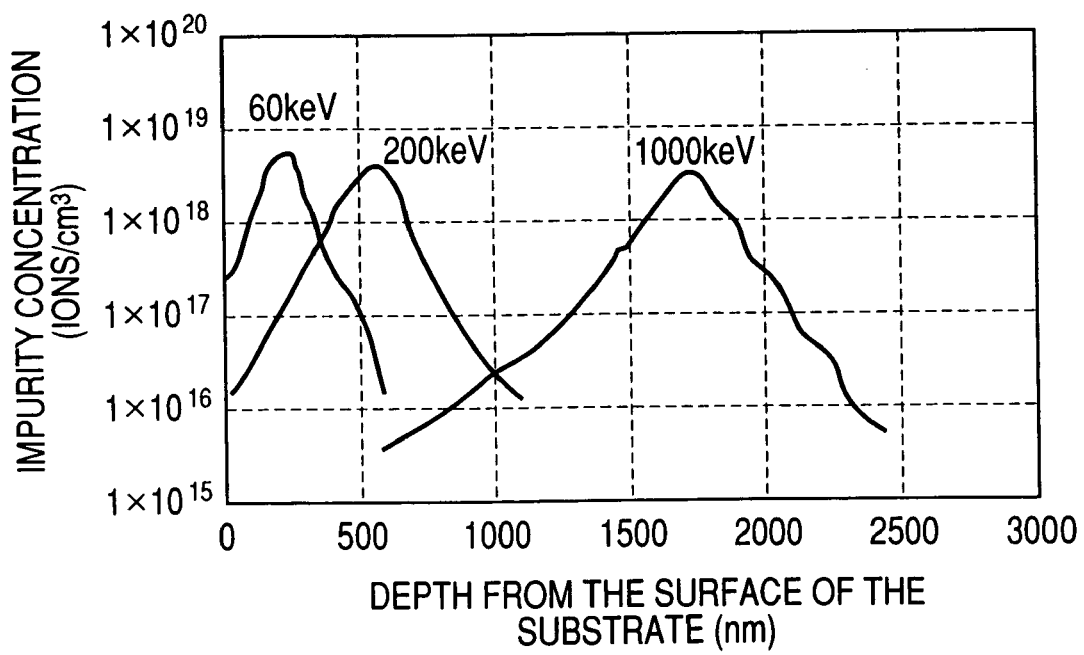
FIG. 25 is a schematic representation showing a depth from the surface of a substrate and impurity concentration distribution when dopant ions are implanted into the off-angle substrate.

FIG. 24 is a schematic representation showing the relationship between depth from the surface of the substrate (the wafer W1), and impurity concentration distribution, when B ions as a dopant are implanted into the first wafer W1 from a direction perpendicular to the top surface. FIG. 24 shows three different cases of B ion implantation energies, namely 60 keV, 200 keV, and 1000 keV. FIG. 25 is a schematic representation showing the relationship between depth from the surface of the substrate (the second wafer) and impurity concentration distribution when B ions as a dopant are implanted into the second wafer that is the off-angle substrate with the angle θ set to 4° from a direction perpendicular to the top surface. FIG. 25 shows three different cases of B ion implantation energies, namely 60 keV, 200 keV, and 1000 keV. As shown in FIGS. 24 and 25, in the case of the B ions being implanted into the second wafer, the impurity concentration distribution is steeper as compared to the B ions being implanted into the first wafer, and the greater the B ion implantation energies, the more pronounced is this tendency. That is, when the p-type semiconductor region 14 is formed by implanting the B ions into the substrate 1 from the direction perpendicular to the top surface, the spread of the B ions as implanted, due to channeling, may be prevented by use of the off-angle substrate as the substrate 1. As a result, the localized formation of the p-type semiconductor region 14 inside the p$^-$type semiconductor region 13 can be implemented.

After the formation of the gate pad GP, the gate interconnect 21, and the source pad 22, for example, a polyimide resin film as a protective film may be applied over the substrate 1, and portions of the polyimide resin film, on top of the gate interconnect 21 and the source pad 22, may be removed by exposure and development, thereby forming openings.

Subsequently, after protecting the surface of the substrate 1 with, for example, a tape, the substrate 1 may be turned upside down such that a protected face thereof is on the underside, and the back surface of the n$^+$ type single crystal silicon substrate 1A is on the upper side. Subsequently, for example, a Ti (titanium) film, a Ni (nickel) film, and an Au (gold) film, as electrically conductive films, may be sequentially deposited over the back surface of the n$^+$ type single crystal silicon substrate 1A by, for example, a sputtering process, thereby forming a stacked film. The stacked film may serve as an extraction electrode (drain electrodes) for the drain (the n$^+$ type single crystal silicon substrate 1A and the n$^-$ type single crystal silicon layer 1B).

When the protection, such as the tape, is removed, and after forming bump electrodes made of, for example, Au, over the openings formed in the polyimide resin film, dicing may be applied to the substrate, along, for example, dividing regions, thereby dividing the substrate into individual chips. Thereafter, the individual chips may be placed on respective lead frames (mounting boards) having, for example, external pins, and may be encapsulated (mounted) with resin or the like.

Figure 26:
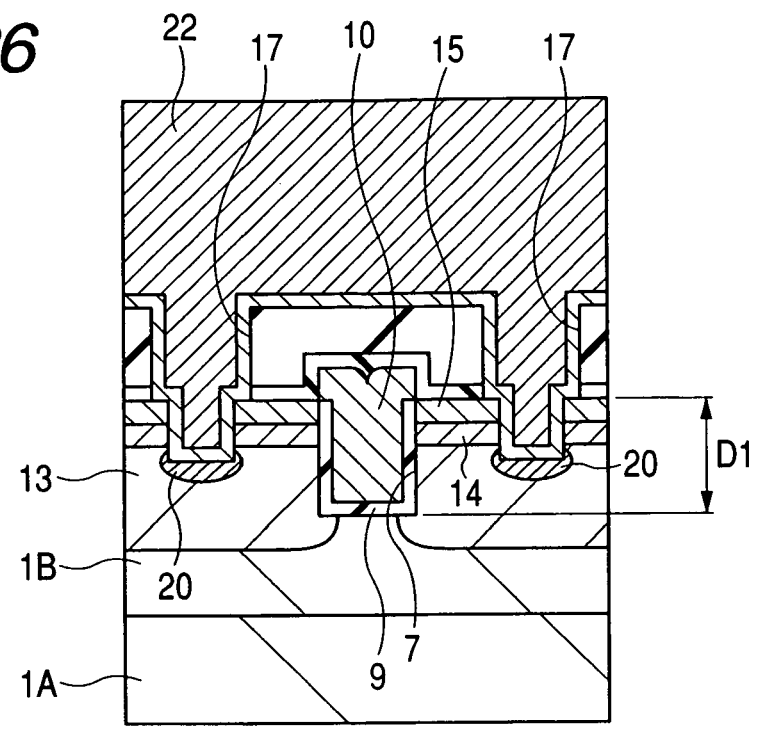
FIG. 26 is a sectional view of a semiconductor device.

As shown in FIG. 26, a p$^-$type semiconductor region 13 may serve as a channel layer for respective power MISFETs, formed to completely cover the side face of a groove 7, and the whole face or part of the bottom of the groove 7 may be in contact with a n$^-$type single crystal silicon layer 1B. The formation of the p$^-$type semiconductor region 13 as described may be implemented by changing, for example, heat treatment temperature or heat treatment time at the time of forming the p$^-$ type semiconductor region 13. By forming the p$^-$type semiconductor region 13 as described, a surface area of a thermal oxidation film 9, extending from the p$^-$ type semiconductor region 13 toward the n$^-$type single crystal silicon layer 1B, can be rendered smaller. Accordingly, feedback capacitance among capacitance components in a gate insulator (the thermal oxidation film 9) acting as a capacitance insulator and a gate electrode 10 acting as a capacitance electrode may be reduced. By use of such power MISFETs as switching elements of the DC-DC converter (refer to FIG. 15), a switching loss may be further reduced.

Figure 27:
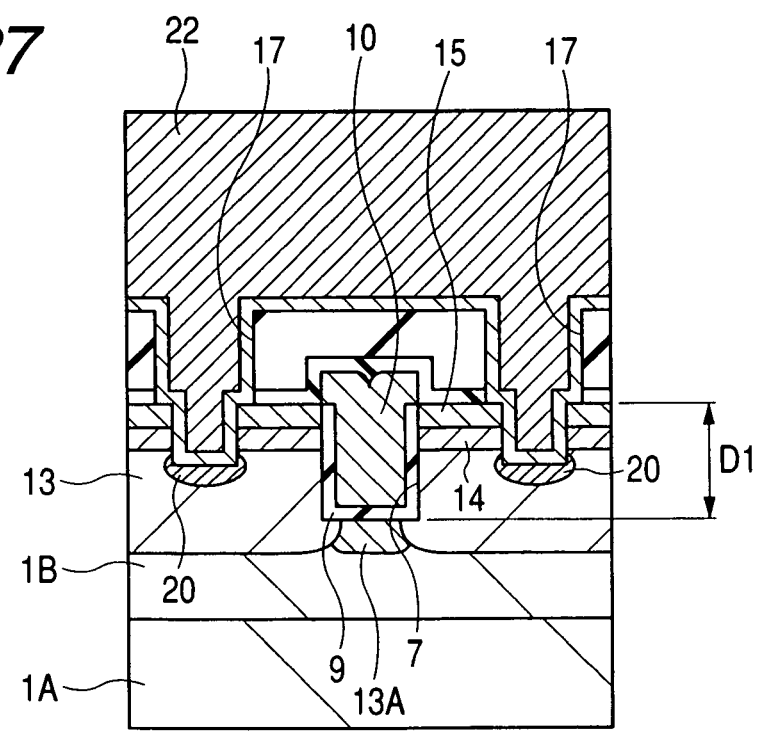
FIG. 27 is a sectional view of the semiconductor device.

As described with reference to FIG. 26, since the p⁻type semiconductor region 13 is formed so as to completely cover the side face of the groove 7 by implantation B ions, the bottom of the groove 7 may be covered with the p⁻type semiconductor region 13 due to manufacturing variation occurring to a depth of the groove 7. For this reason, as shown in FIG. 27, directly underneath the groove 7, there may be formed an n⁻type semiconductor region (a sixth semiconductor layer) 13A having a conductivity type opposite to that for the p⁻type semiconductor region 13, and having an impurity concentration at substantially the same level as that of the p⁻type semiconductor region 13, but having a higher impurity concentration than the n⁻type single crystal silicon layer 1B. Thereby, it is possible to prevent the p⁻type semiconductor region 13 from covering the bottom of the groove 7. Accordingly, even if manufacturing variation occurs to the depth of the groove 7, the surface area of the thermal oxidation film 9, extending from the p⁻ type semiconductor region 13 toward the n⁻type single crystal silicon layer 1B, can be maintained at a predetermined size.

The n⁻type semiconductor region 13A described can be formed by implanting n-type dopant ions (for example, As) from the bottom of the groove 7, after the formation of the groove 7 but prior to the formation of the thermal oxidation film 9, using the silicon oxide film 3 (refer to FIG. 3) as a mask. Further, since the dopant ions are implanted by use of the silicon oxide film 3 as the mask, the patterning of a photo resist film over a substrate 1, such as for use as a mask when implanting the dopant ions, can be omitted. It therefore follows that the n⁻ type semiconductor region 13A can be formed simply by increasing by one the number of manufacturing steps, for implantation of the dopant ions.

Figure 28:
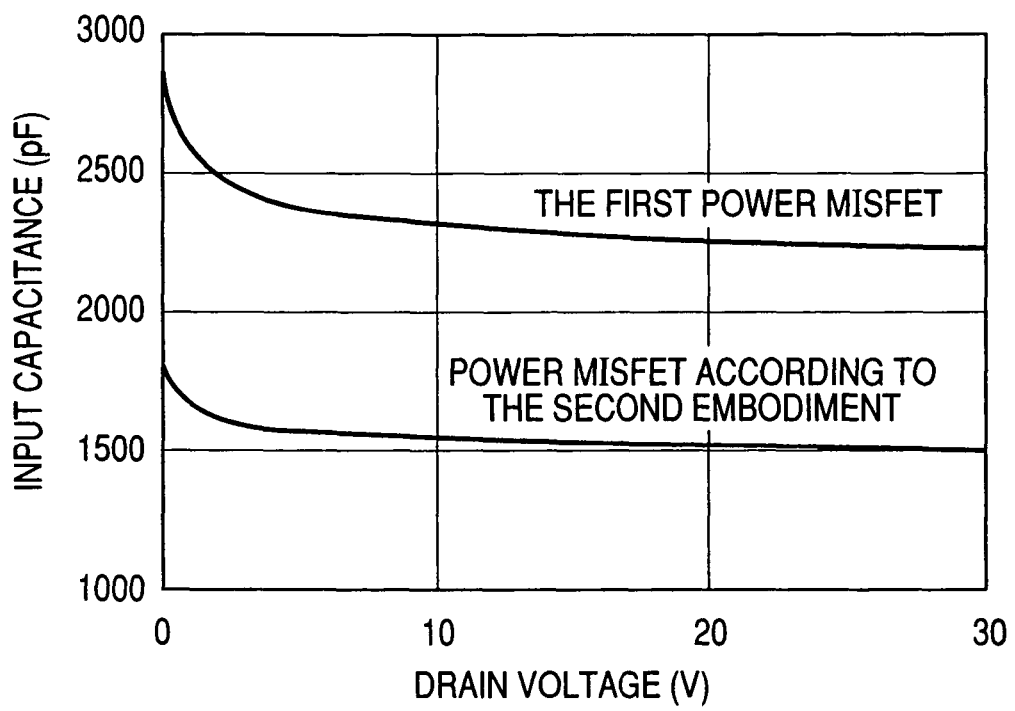
FIG. 28 is a schematic representation showing a drain voltage and an input capacitance in the case of a power MISFET.
Figure 29:
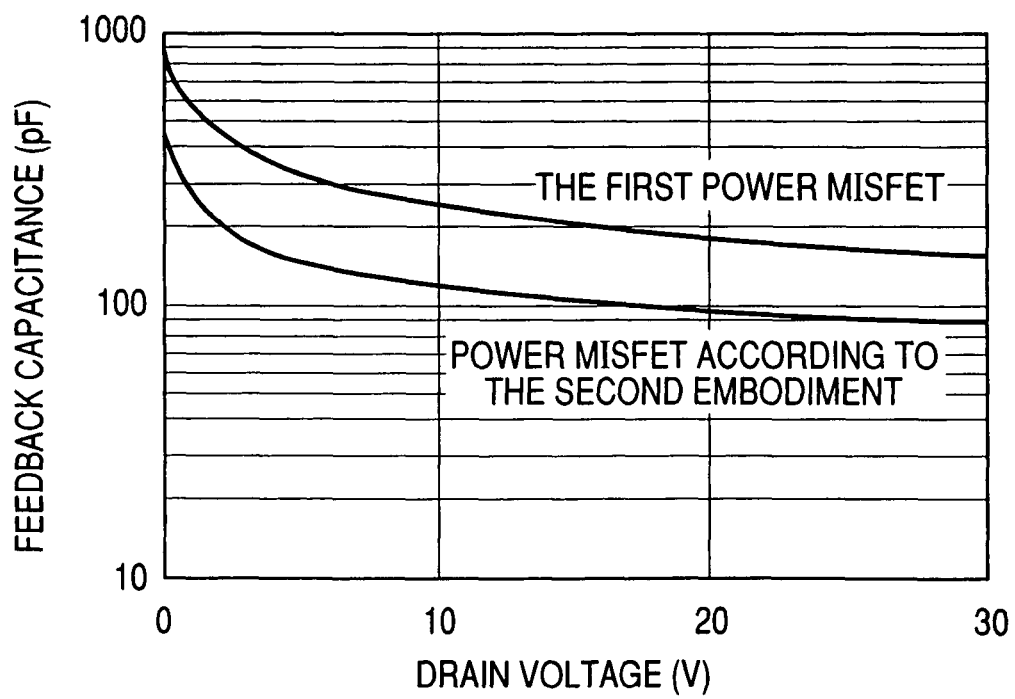
FIG. 29 is a schematic representation showing the drain voltage and a feedback capacitance in the case of a power MISFET.

FIG. 28 shows the relationship between a drain voltage and an input capacitance in the power MISFET having the n⁻type semiconductor region 13A as described with reference to FIG. 27, and in the first case power MISFET. Further, FIG. 29 shows the relationship between the drain voltage and a feedback capacitance in a power MISFET having the n⁻type semiconductor region 13A as described with reference to FIG. 27, and in the first case power MISFET. As shown in FIGS. 28 and 29, wherein the groove 7 is formed at a shallow depth, the p⁻type semiconductor region 13 completely covers the side face of the groove 7, and the n⁻type semiconductor region 13A is formed directly underneath the groove 7, both the input capacitance and the feedback capacitance can be reduced as compared with the first case power MISFET. In the case of using such a power MISFET as the switching element of the DC-DC converter (refer to FIG. 15), a loss of the DC-DC converter can be considerably reduced. Accordingly, higher efficiency of a DC-DC converter system can be implemented.

Figure 30:
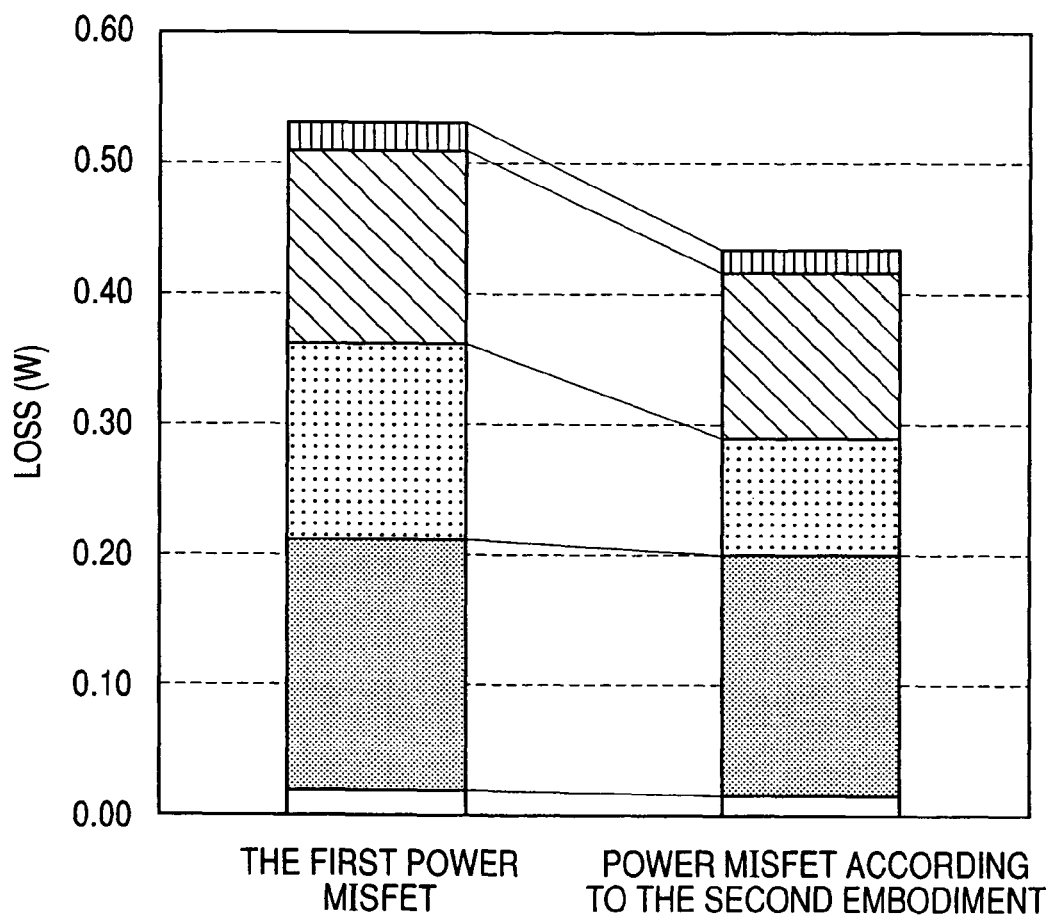
FIG. 30 is a schematic representation showing calculation results on respective losses of a power MISFET, in the case of those being used as the switching element of the DC-DC converter.

FIG. 30 shows calculation results of respective losses of the power MISFET according to an embodiment wherein the n⁻type semiconductor region 13A is as described with reference to FIG. 27, and wherein the power MISFET is the first case power MISFET, wherein the respective power MISFETS are used as the switching elements of the DC-DC converter (refer to FIG. 15). The conditions illustrated are that the input voltage Vin is at 12V, the output voltage Vout at 1.3V, the output current Iout at 2A, and the circuit operation frequency at 1 MHz. With the power MISFET according to the second embodiment, the groove 7 is formed at a shallower depth as compared with the case of the first power MISFET studied by the inventors, so that the input capacitance of the power MISFET can be reduced. As shown in FIG. 30, in the case of using the power MISFET wherein the groove 7 is formed at a shallower depth, a drive loss of the DC-DC converter can be reduced as compared with the first case power MISFET, and such reduction in the drive loss may amount to about 20%.

Figure 31:
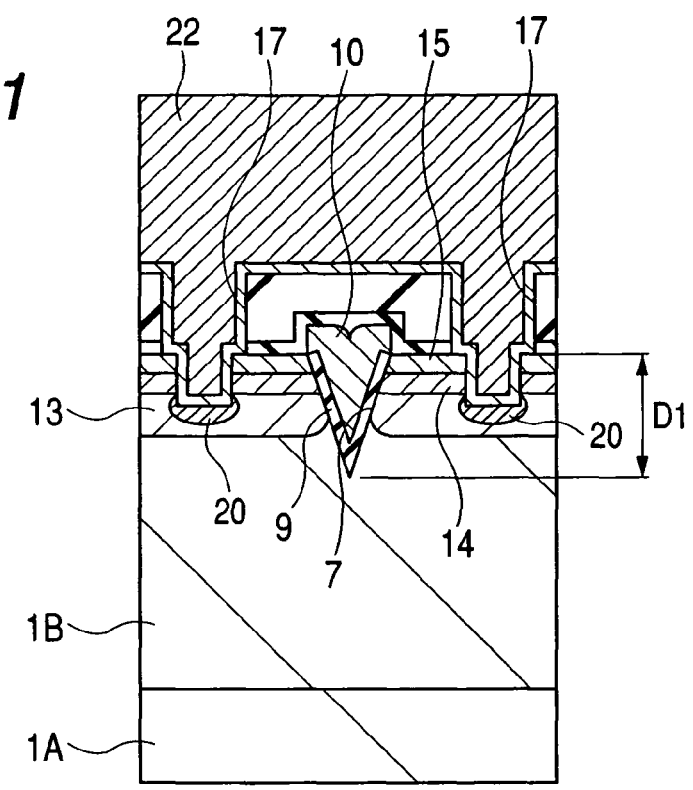
FIG. 31 is a sectional view of a semiconductor device.

As shown in FIG. 31, a groove 7 for forming a gate electrode 10 of the power MISFET may be formed in a V shape (in a shape tapering to the bottom of the groove 7). The formation of the groove 7 as described can be implemented by adopting wet etching with KOH (potassium hydroxide), or by adjusting a composition ratio of an etching gas used in dry etching when executing the etching of a substrate 1 for forming the groove 7, for example. By forming the groove 7 as described, a surface area of a portion of the groove 7 (the thermal oxidation film 9), under an n⁺ type semiconductor region 15, and a surface area of a portion of the groove 7 (the thermal oxidation film 9) in contact with an n⁻type single crystal silicon layer 1B, can be reduced. As a result, both an input capacitance and a feedback capacitance can be reduced. Further, a loss of the DC-DC converter can be considerably reduced.

Figure 32:
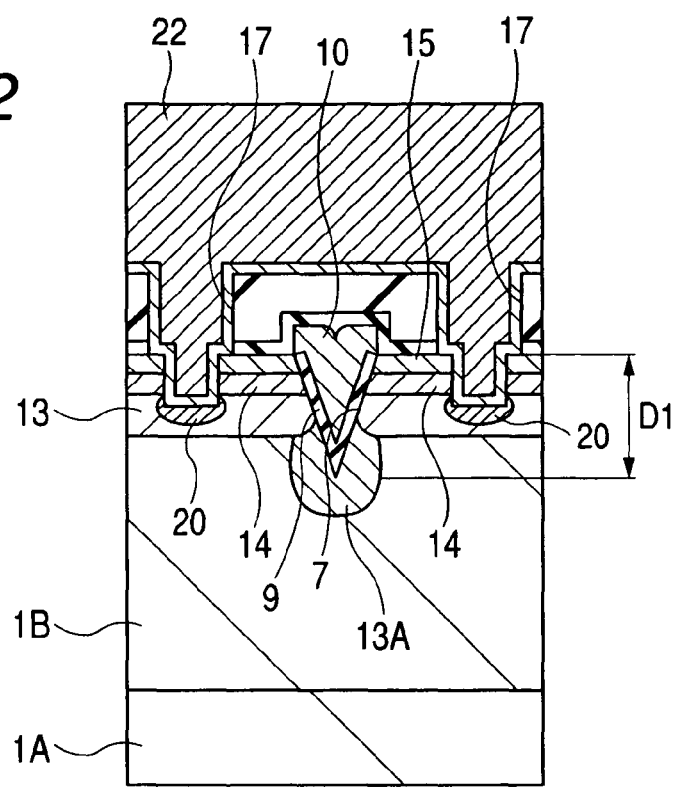
FIG. 32 is a sectional view of the semiconductor device.
Figure 33:
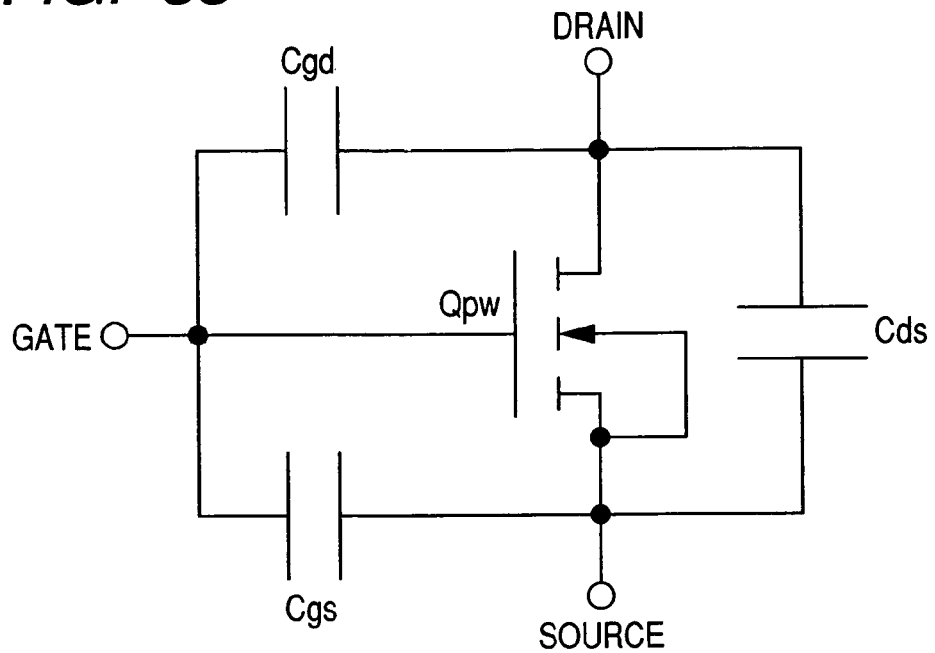
FIG. 33 is an equivalent circuit diagram for describing feedback capacitance and input capacitance of a power MISFET.
Figure 34:
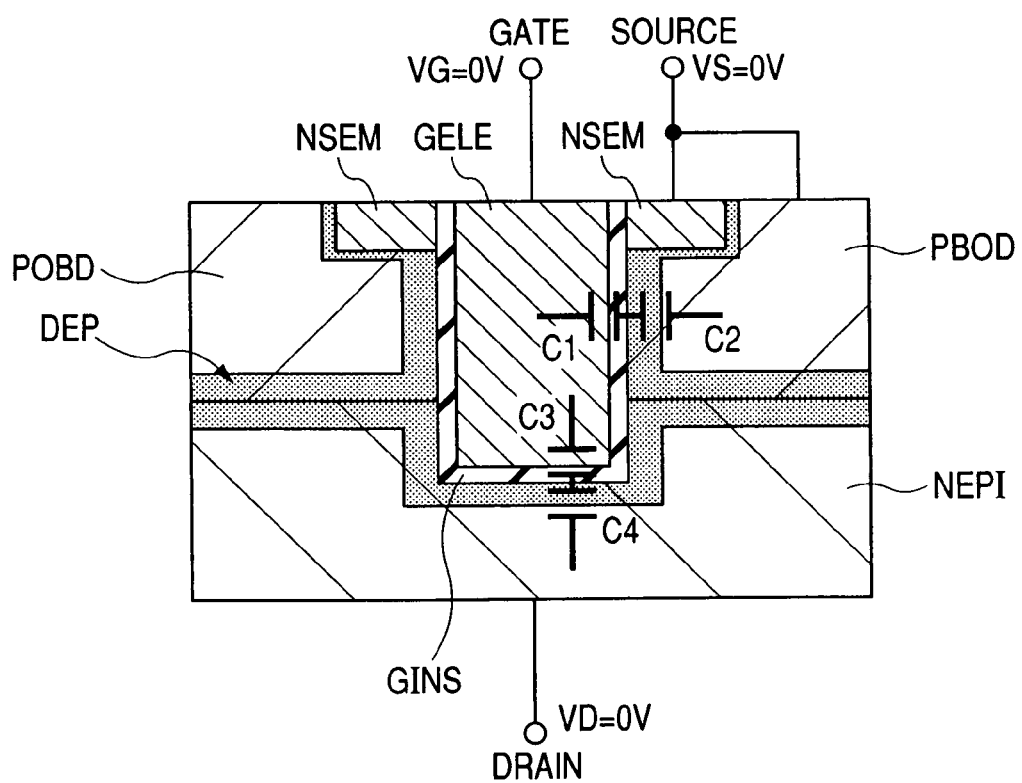
FIG. 34 is a sectional view of the power MISFET in FIG. 33, and describes capacitance between a gate and a source, and capacitance between the gate and a drain.
Figure 35:
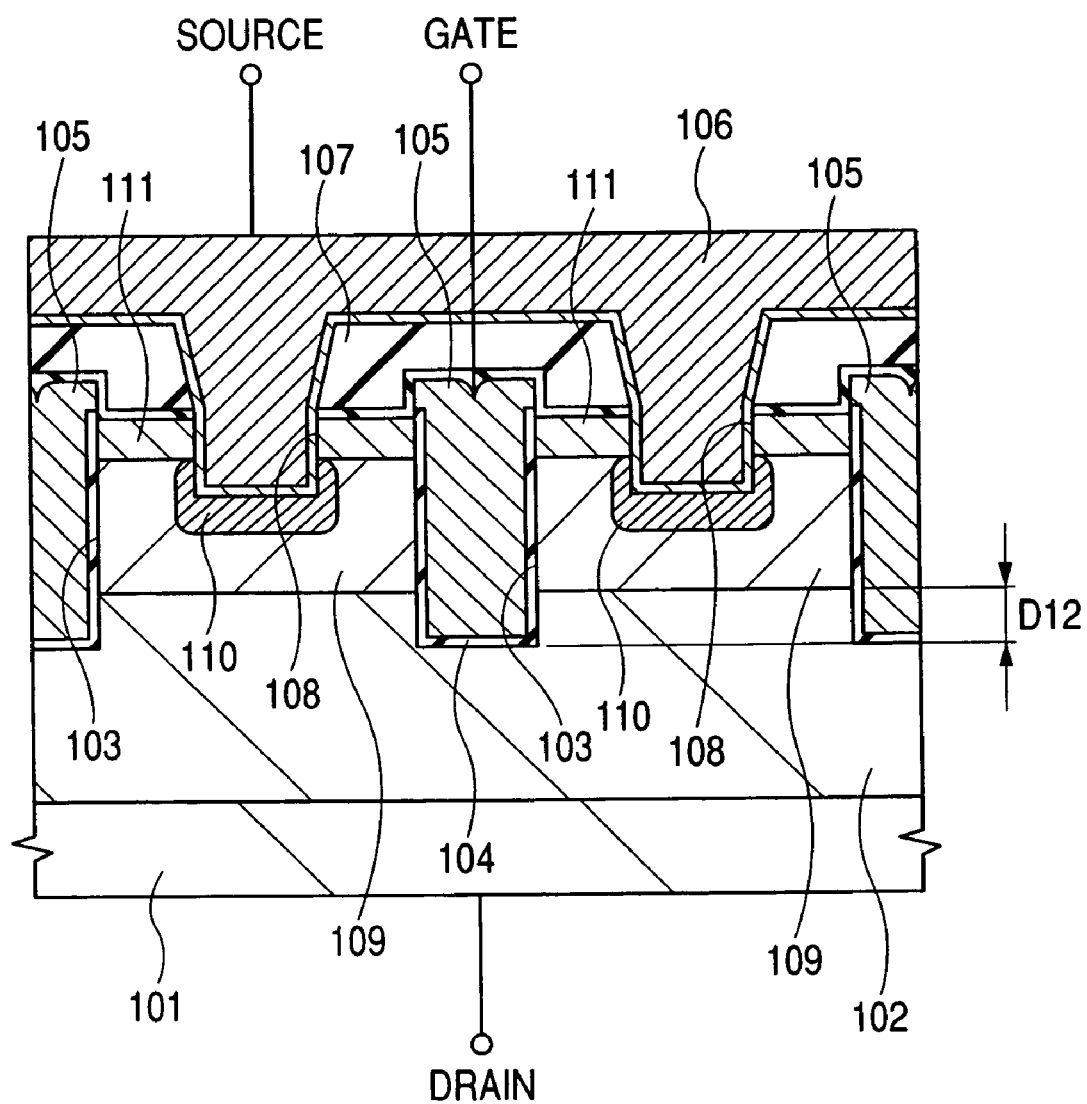
FIG. 35 is a sectional view of a trench gate type power MISFET.

As shown in FIG. 32, directly underneath the groove 7 there may be formed an n⁻ type semiconductor region 13A. Since the n⁻type semiconductor region 13A is formed so as to cover the bottom of the groove 7, it is possible to prevent the p⁻ type semiconductor region 13 from covering the bottom of the groove 7. Accordingly, a surface area of the thermal oxidation film 9, extending from the p⁻ type semiconductor region 13 toward the n⁻type single crystal silicon layer 1B, can be maintained at a predetermined size.

The semiconductor device according to the present invention can be used as a switching element of a DC-DC converter for use as a power source circuit of, for example, a computer.

If not otherwise stated herein, it may be assumed that all components and/or processes described heretofore may, if appropriate, be considered to be interchangeable with similar components and/or processes disclosed elsewhere in the specification. It should be appreciated that the systems and methods of the present invention may be configured and conducted as appropriate for any context at hand. The embodiments described hereinabove are to be considered in all respects only as illustrative and not restrictive. As such, all modifications and variations of the present invention that come within the meaning, range, and equivalency of the claims hereinbelow are to be embraced within the scope thereof.

What is claimed is:

1. A method of manufacturing a semiconductor device including a trench gate type MISFET, the trench gate type MISFET comprising:
a semiconductor substrate having a main surface and a bottom surface opposite to the main surface, the semiconductor substrate having a first conductivity type;
a first semiconductor layer formed on the main surface of the semiconductor substrate, the first semiconductor layer having a top surface apart from the semiconductor substrate, the first semiconductor layer having the first conductivity type, and the first semiconductor layer acting as a drain region of the MISFET;
a trench formed on the top surface of the first semiconductor layer, a distance between the top surface of the first semiconductor layer and a bottom of the trench being not more than 1 μm;
a gate insulating film of the MISFET formed on an inner surface of the trench;
a gate electrode of the MISFET formed on the gate insulating film in the trench;
a channel forming region of the MISFET formed in the first semiconductor layer, the channel forming region being in contact with the trench, the bottom of the trench being positioned below a bottom of the channel forming region, and the channel forming region having a second conductivity type opposite to the first conductivity type;
    a source region of the MISFET formed over the channel forming region in the first semiconductor layer; the source region being in contact with the trench, and the source region having the first conductivity type; and
    a punch through stopper region formed between the source region and channel forming region in the first semiconductor layer, the punch through stopper region having the second conductivity type, and the punch through stopper region having a higher impurity concentration than the channel forming region,
    wherein the method comprising steps of:
    forming the trench formed in the first semiconductor layer;
    forming the gate insulating film on the trench;
    forming the gate electrode of the MISFET on the gate insulating;
    after the gate electrode forming step, introducing a first impurity to form the channel forming region by a first ion implantation; and
    after the gate electrode forming step, introducing a second impurity to form the punch through stopper region by a second ion implantation in the channel region different from the first ion implantation such that a concentration distribution of the punch through stopper region is decided by a concentration distribution of the second ion implantation and such that the punch through stopper region has an impurity concentration relatively flat,
    wherein the second impurity is diffused by heat treatment such that the channel forming region has an impurity concentration gradually decreased, in a depth direction along the trench, from an interface portion between the channel region and the punch through stopper region to an interface portion between the channel region and the semiconductor layer.

2. The method according to claim 1, wherein the second ion implantation is performed after a diffusion of the first impurity of the first ion implantation using heat treatment.

3. The method according to claim 1, wherein the first semiconductor layer is formed by an epitaxial growth method.

4. The method according to claim 1, further comprising the steps of:
    forming a drain electrode on the bottom surface of the semiconductor substrate, the drain electrode being electrically connected with the semiconductor substrate and first semiconductor layer;
    forming an interlayer insulating film over the gate electrode and source region;
    forming a contact groove in the insulating film, a part of the source region being exposed from the contact groove; and
    forming a source electrode in the contact groove, the source electrode being electrically connected with the source region.

5. A method of manufacturing a semiconductor device including a trench gate type MISFET,
    the trench gate type MISFET comprising:
    a semiconductor substrate having a main surface and a bottom surface opposite to the main surface, the semiconductor substrate having a first conductivity type;
    a first semiconductor layer formed on the main surface of the semiconductor substrate, the first semiconductor layer having a top surface apart from the semiconductor substrate, the first semiconductor layer having the first conductivity type, and the first semiconductor layer acting as a drain region of the MISFET;
    a trench formed on the top surface of the first semiconductor layer, a distance between the top surface of the first semiconductor layer and a bottom of the trench being not more than 1 µm;
    a gate insulating film of the MISFET formed on an inner surface of the trench;
    a gate electrode of the MISFET formed on the gate insulating film in the trench;
    a channel forming region of the MISFET formed in the first semiconductor layer and being in contact with the trench, the bottom of the trench being positioned below a bottom of the channel forming region, and the channel forming region having a second conductivity type opposite to the first conductivity type;
    a source region of the MISFET formed over the channel forming region in the first semiconductor layer; the source region being in contact with the trench, and the source region having the first conductivity type; and
    a punch through stopper region formed between the source region and channel forming region in the first semiconductor layer and being in contact with a top of the channel forming region, the punch through stopper region having the second conductivity type and having a higher impurity concentration than the channel forming region,
    wherein the method comprising steps of:
    forming the trench formed in the first semiconductor layer;
    forming the gate insulating film on the trench;
    forming the gate electrode of the MISFET on the gate insulating;
    after the gate electrode forming step, introducing a first impurity to form the channel forming region by a first ion implantation; and
    after the gate electrode forming step, introducing a second impurity to form the punch through stopper region by a second ion implantation in the channel region different from the first ion implantation such that a concentration distribution of the punch through stopper region is decided by a concentration distribution of the second ion implantation and such that the punch through stopper region has an impurity concentration relatively flat,
    after the gate electrode forming step, diffusing the second impurity by heat treatment such that the channel forming region has an impurity concentration gradually decreased, in a depth direction along the trench, from the top of the channel region to the bottom of the channel region.

6. The method according to claim 5, wherein the first semiconductor layer is formed by an epitaxial growth method.

7. The method according to claim 5, wherein the second ion implantation is performed after the channel forming region forming.

8. The method according to claim 5, further comprising the steps of:
    forming a drain electrode on the bottom surface of the semiconductor substrate, the drain electrode being electrically connected with the semiconductor substrate and first semiconductor layer;
    forming an interlayer insulating film over the gate electrode and source region;
    forming a contact groove in the insulating film, a part of the source region being exposed from the contact groove; and
    forming a source electrode in the contact groove, the source electrode being electrically connected with the source region.

* * * * *